(12) United States Patent
Tateshita

(10) Patent No.: US 8,030,708 B2
(45) Date of Patent: Oct. 4, 2011

(54) INSULATED GATE FIELD-EFFECT TRANSISTOR

(75) Inventor: Yasushi Tateshita, Kanagawa (JP)

(73) Assignee: Sony Corporation, Tokyo (JP)

( * ) Notice: Subject to any disclaimer, the term of this patent is extended or adjusted under 35 U.S.C. 154(b) by 362 days.

(21) Appl. No.: 11/325,008

(22) Filed: Jan. 4, 2006

(65) Prior Publication Data

US 2006/0157797 A1    Jul. 20, 2006

(30) Foreign Application Priority Data

Jan. 6, 2005 (JP) .............. P2005-001608

(51) Int. Cl.
H01L 29/78 (2006.01)
(52) U.S. Cl. .............. 257/369; 257/213; 257/368
(58) Field of Classification Search .......... 257/262, 257/368–401, E29.255–E29.316, 213; 438/135, 438/151, 197, 199, 201, 207, 216, E21.409–E21.449
See application file for complete search history.

(56) References Cited

U.S. PATENT DOCUMENTS

| | | | | |
|---|---|---|---|---|
| 6,124,627 | A * | 9/2000 | Rodder et al. | 257/616 |
| 6,346,447 | B1 * | 2/2002 | Rodder | 438/300 |
| 6,492,696 | B2 * | 12/2002 | Morimoto et al. | 257/412 |
| 7,303,965 | B2 * | 12/2007 | Oowaki et al. | 438/300 |
| 2004/0045499 | A1 * | 3/2004 | Langdo et al. | 117/84 |
| 2005/0051851 | A1 * | 3/2005 | Chen et al. | 257/369 |
| 2005/0176220 | A1 * | 8/2005 | Kanemoto | 438/481 |

FOREIGN PATENT DOCUMENTS

| | | |
|---|---|---|
| JP | 06-077246 | 3/1994 |
| JP | 07-086579 | 3/1995 |
| JP | 09-045913 | 2/1997 |

(Continued)

OTHER PUBLICATIONS

Shigeru Nishimatsu, et al., "Groove Gate MOSFET, 8th Conference On Solid State Devices," Japanese Journal of Applied Physics, 1976, Supplement 16-1, vol. 16, pp. 179 to 183.
Takashi Uchino, et al. "A Raised Source/Drain Technology Using In-situ P-doped SiGe and B-doped Si for 0.1 μm CMOS ULSIs," IEDM 1997, pp. 479 to 482.

(Continued)

*Primary Examiner* — Howard Weiss
*Assistant Examiner* — Tifney L Skyles
(74) *Attorney, Agent, or Firm* — SNR Denton US LLP

(57) ABSTRACT

The invention aims at precisely making an effective junction depth sufficiently small with respect to a substrate surface having a steep PN junction stable in its configuration and having a channel formed therein in relation to an extension portion. Gate electrodes are formed on a P-type well and an N-type well through respective gate insulating films. Two extension portions are formed from two first epitaxial growth layers which contact regions, of the P-type well and the N-type well, where channels are to be formed, respectively, and which are at a distance from each other. Two second epitaxial growth layers are formed on the first epitaxial growth layers in positions which are further at a distance from facing ends of the two extension portions in a direction of being separate from each other. Thus, two source/drain regions are formed on a PMOS side and on an NMOS side each. In the case of this structure, there is adopted no ion implantation for introducing impurities into a deep portion. Hence, the impurities in the extension portions do not thermally diffuse into the substrate side through the activation anneal.

3 Claims, 20 Drawing Sheets

FOREIGN PATENT DOCUMENTS

| | | |
|---|---|---|
| JP | 11-251454 | 9/1999 |
| JP | 2000-082813 | 3/2000 |
| JP | 2000-216386 | 8/2000 |
| JP | 2004-031753 | 1/2004 |

OTHER PUBLICATIONS

Japanese Office Action dated May 18, 2011 for Japanese Application No. 2005-001608.

* cited by examiner

INSULATED GATE FIELD-EFFECT TRANSISTOR

CROSS REFERENCES TO RELATED APPLICATIONS

The present invention contains subject matter related to Japanese Patent Application P2005-001608 filed in the Japanese Patent Office on Jan. 6, 2005, the entire contents of which being incorporated herein by reference.

BACKGROUND OF THE INVENTION

The present invention relates to an insulated gate field-effect transistor having an extension portion in each of two source/drain regions through which a current is supplied to a region of a semiconductor substrate which faces a gate electrode through a gate insulating film and which has a channel formed therein, and a method of manufacturing the same.

With respect to the scaling of an insulated gate field-effect transistor (hereinafter referred to as "a MIS transistor"), in the International Technology Roadmap for Semiconductors (ITRS), a transistor gate length Lg of a technology node hp32 is expected to become equal to or shorter than 20 nm.

In order to realize such a fine MIS transistor, it is necessary to perform the scaling of an effective oxide thickness (EOT) of an oxide film becoming a gate insulating film, and a junction depth Xj of a source/drain region concurrently with the scaling of the gate length Lg. The scaling of the EOT of the oxide film is required to ensure a drain current Ids for determining a transistor driving ability. In addition, the scaling of the junction depth Xj of the source/drain region is required to suppress the Short Channel Effect (SCE). In order to suppress the short channel effect, in particular, an electric field at a drain end needs to be relaxed. In order to attain this, there is provided a shallow junction region, referred to as the so-called Lightly Doped Drain (LDD) or an Extension, which extends from a heavily doped source/drain region to a channel side.

Normally, the extension portion of the MIS transistor is formed by implanting ions into a semiconductor substrate (or a well) in which the channel is to be formed.

However, the ion implantation technique and activation anneal technique for forming a very shallow junction which is applicable to the above-mentioned fine MIS transistor are not yet established. In addition, even if the very shallow junction can be formed by utilizing the ion implantation method, owing to its thinness, its resistance value becomes large and a series resistance value of the source and the drain increases to reduce the driving ability of the MIS transistor. Moreover, a portion, of the extension portion connected to the channel, which a gate electrode overlaps each other has a small resistance value since the carriers are accumulated therein. However, a region of the extension portion other than that portion is easy to have a large resistance value due to exhaustion of the carriers in a depletion layer. In order to prevent such a situation, the concentration of the extension portion must be increased, or the extension portion must be deeply formed. However, this is inconsistent with the suppression of the short channel effect.

A Groove Gate transistor has been proposed as the transistor having a structure adapted to solve this contradiction (refer to Non-patent document 1: Nishimatsu, et al.: Groove Gate MOSFET, 8th Conf. On Solid State Device, pp. 179 to 183, 1976).

The basic concept of this transistor structure is to make that a formation surface of a source/drain region is caused to be located upward with respect to a substrate surface having a channel formed therein to reduce an effective junction depth with respect to the channel of the source/drain region, and that the source/drain region is deeply formed to reduce its resistance value compatible with each other.

A MIS transistor in which an epitaxial growth layer is grown in substrate regions on both sides of a gate instead of forming a groove in a portion of the substrate on which a gate is to be formed, and a source/drain region is formed on the epitaxial growth layer is known as one to which that basic concept is applied (refer to, for example, Patent document 1: Japanese Patent Laid-open No. 2000-82813 (a first embodiment mode and FIG. 9)). Such a source/drain structure is called a raised (or elevated) source/drain (S/D).

According to the description of Patent document 1, a first source/drain region is formed in an inclined end portion of an epitaxial growth layer, and a second source/drain region deeper than the first source/drain region is formed in a portion of the epitaxial growth layer which is at a distance from a gate. The first source/drain region is considered to correspond to the so-called extension portion.

On the other hand, a MIS transistor is known in which an extension portion is formed from an eptaxial growth layer grown on a substrate surface, and ions are implanted from a position above the extension portion into a portion of the extension portion which is at a distance from a gate end and a substrate surface portion below that portion, thereby forming a source/drain region (refer to, for example, Non-patent document 2: Uchino, et al.: A Raised Source/Drain Technology Using In-situ P-doped SiGe and B-doped Si for 0.1 μm CMOS ULSIs, IEDM 1997, pp. 479 to 482 (1977)).

In the technique described in Patent document 1, after the epitaxial growth layer is formed, the insulating film is formed on the whole surface including the inclined end portions of the epitaxial growth layer. Thereafter, the first source/drain region and the second source/drain region are simultaneously formed by using the ion implantation method. While not described especially in Patent document 1, in this case, the ion implantation is easy to block as the gate is further approached by the insulating film portion which is formed on the inclined end portions and on sidewalls of the gate. It is estimated from this that when the second source/drain region is formed, the first source/drain region (corresponding to the extension portion) which is relatively shallower than the second source/drain region is formed so as to accompany the second source/drain region.

However, in the case of the formation of the extension portion utilizing the thickness of the insulating film through which the implanted ions penetrate, when the inclination or the like of the inclined end surface of the epitaxial growth layer contacting the insulating film changes, the configuration of the extension portion necessarily changes. This is unstable. In addition, since no ions are implanted into a portion of the gate sidewall under the insulating film, no impurities are introduced thereinto. Hence, there is encountered a problem that a space is defined between the extension portion (the first source/drain region) and the channel layer and thus this space portion has a large resistance value in some cases. In order to avoid this problem, it is required to sufficiently perform the anneal to thermally diffuse the implanted impurities, or to partially stack the gate electrode on the inclined end portion of the epitaxial growth layer. Thus, Patent document 1 discloses the technique for precisely stacking the gate electrode on the inclined end portion.

However, in the case of the technique disclosed in Patent document 1, though the stacking width between the inclined end portion and the gate electrode becomes nearly constant, there is the possibility that the extension portion disperses in position with respect to the inclined end portion. This results in that the stacking width between the extension portion and the gate electrode is easy to disperse. In addition, since the ion implantation method is used, there is also the possibility that the implanted impurities are excessively thermally diffused by the activation anneal, and the stacking width becomes larger than is needed. For this reason, in the case of the technique disclosed in Patent Document 1, the short channel effect increases, and thus it is impossible to effectively prevent the transistor characteristics from being reduced.

In addition, in the case of Patent Document 1, since the extension portion is formed by implanting the ions into the epitaxial growth layer, a steep PN junction is not obtained and the depletion layer is easy to spread. In other words, the impurity concentration distribution obtained by utilizing the ion implantation method has a concentration peak in the vicinity of the surface or in a portion which is deep from the surface side. However, the depletion layer is easy to spread since a tail portion of the impurity distribution lies in the vicinity of the PN junction, and the concentration decreases in the tail portion. For this reason, owing to the depletion layer, the exhaustion of the carriers is caused in a portion, connected to the channel, of the extension portion formed by utilizing the ion implantation method. Thus, this portion is easy to have the high resistance value.

On the other hand, in the case of the technique disclosed in Non-patent document 2, the extension portion is formed by utilizing the epitaxial growth method. Since the epitaxial growth layer is normally thin, in order to prevent the junction leakage current due to formation of a silicide layer, it is required that when the source/drain region is formed, the ion implantation energy is increased and the impurities are deeply introduced into the substrate. For this reason, in order to sufficiently increase the activation rate of the impurities, the activation anneal method needs to be performed at a high temperature. As a result, there is encountered a problem that the impurities thermally diffuse from the extension portion into the substrate at that time, and the effective junction depth Xj of the extension portion with respect to the substrate surface having the channel formed therein becomes deeper in that portion than is needed.

SUMMARY OF THE INVENTION

In the light of the foregoing, it is desirable to provide an insulated gate field-effect transistor in which a steep PN junction having a stable configuration is formed below a source/drain region having an extension portion, and an effective junction depth can be precisely made sufficiently small with respect to a substrate surface having a channel firmed therein, and a method of manufacturing the same.

In order to attain the desire described above, according to an embodiment of the present invention, there is provided an insulated gate field-effect transistor having a region of a semiconductor substrate in which a channel is formed so as to face a gate electrode through a gate insulating film, two extension portions which contact the region and which are formed at a distance from each other, and two source/drain regions which are formed further at a distance from facing ends of the two extension portions in a direction of being separate from each other, in which each of the two extension portions is formed from a first epitaxial growth layer on the semiconductor substrate, and each of the two source/drain regions includes a second epitaxial growth layer on the first epitaxial growth layer.

According to another embodiment of the present invention, there is provided a method of manufacturing an insulated gate field-effect transistor having a region of a semiconductor substrate in which a channel is formed so as to face a gate electrode through a gate insulating film, two extension portions which contact the region and which are formed at a distance from each other, and two source/drain regions which are formed further at a distance from facing ends of the two extension portions in a direction of being separate from each other. The method includes the steps of: forming a first spacer having a predetermined width on the semiconductor substrate; forming the two extension portions on the semiconductor substrate through epitaxial growth in which the first spacer is used as a separating layer; forming second spacers each having a predetermined width in two portions which contact both side faces of the first spacer on the two extension portions, respectively; and forming the two source/drain regions on the two extension portions through epitaxial growth in which the two second spacers formed in the two portions, respectively, are used as a separating layer.

According to the present invention, the advantages are provided in which a steep PN junction having a stable configuration is formed below the source/drain region having the extension portion, and an effective junction depth can be precisely made sufficiently small with respect to a substrate surface having a channel firmed therein, and a method of manufacturing the same.

DETAILED DESCRIPTION OF THE PREFERRED EMBODIMENTS

Preferred embodiments of the present invention will hereinafter be described by giving a CMOS device in which an NMOS transistor and a PMOS transistor are formed on the same substrate as an example with reference to the accompanying drawings.

Figure 1:
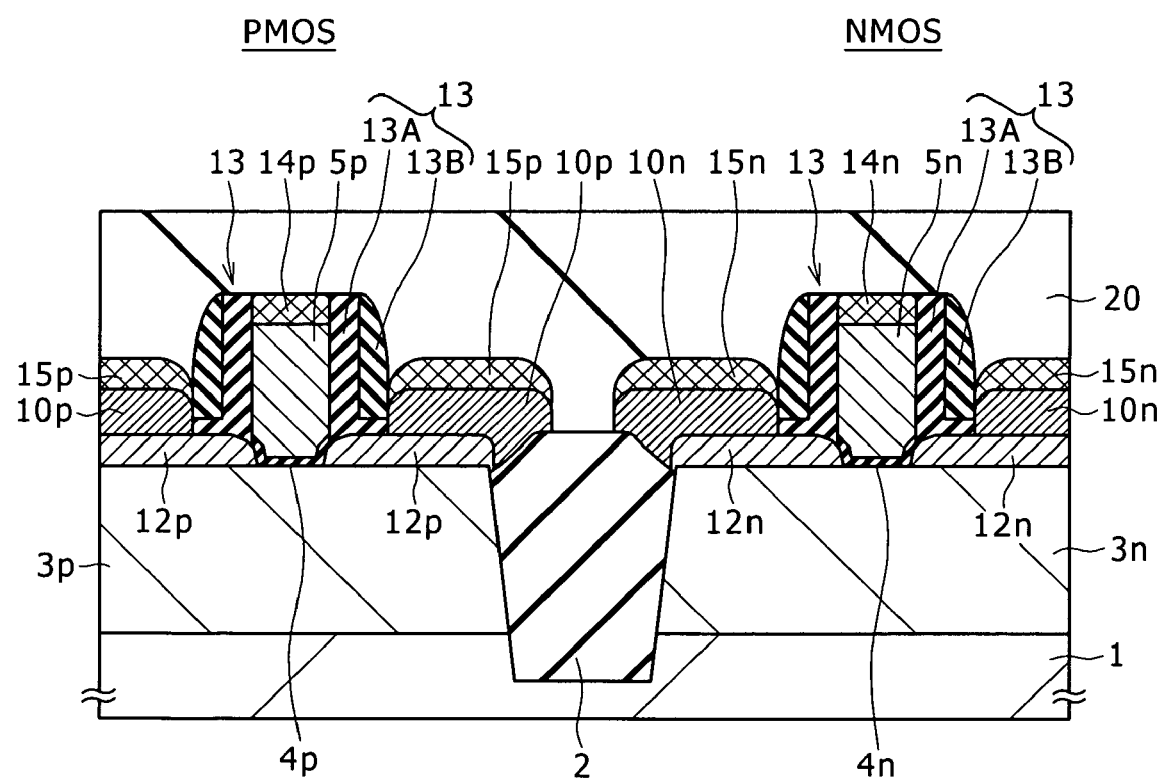
FIG. 1 is a cross sectional view of a CMOS device in a channel direction according to an embodiment of the present invention.

FIG. 1 is a cross sectional view of a CMOS device in a channel direction.

In the CMOS device shown in the figure, an isolation insulating layer, e.g., a Shallow Trench Isolation (STI) 2 is formed in a surface portion of a substrate 1 formed from a silicon wafer for example. Germanium (Ge), a compound of Ge and silicon (Si), or strain silicon may also be used as a material of the substrate 1 in addition to Si.

A P-type region (e.g., a P-type well 3$n$) and an N-type region (e.g., an N-type well 3$p$) in which inversion layers of channels are formed, respectively, are formed in a region (active region) in which no STI 2 is formed. The P-type well 3$n$ is a substrate region in which the NMOS transistor is formed, and the N-type well 3$p$ is a substrate region in which the PMOS transistor is formed.

Two extension portions 12$n$ made from two first epitaxial growth layers, respectively, which are located at a predetermined distance from each other are formed on the P-type well 3$n$. Likewise, two extension portions 12$p$ made from two epitaxial growth layers, respectively, which are located at a predetermined distance from each other are formed on the N-type well 3$p$. Each of the extension portions 12$n$ functions as a part of a source or drain of the NMOS transistor, and contains N-type impurities introduced thereinto. Each of the extension portions 12$p$ functions as a part of a source or drain of the PMOS transistor, and contains P-type impurities introduced thereinto.

Facing sides of the two extension portions 12$n$ have inclined end faces a distance between which increases as the height advances upward. A gate insulating film 4$n$ is formed in parts of these inclined end faces and on the P-type well 3$n$ between these inclined end faces and a gate electrode 5$n$ is formed on the gate insulating film 4$n$.

Likewise, facing sides of the two extension portions 12$p$ have inclined end faces, respectively. A gate insulating film 4$p$ is formed in parts of these inclined end faces and on the N-type well 3$p$ between these inclined end faces. A gate electrode 5$p$ is formed on the gate insulating film 4$p$.

Side faces of the gate electrode 5$n$ on the NMOS transistor side and the gate electrode 5$p$ on the PMOS transistor side are covered with sidewall spacers 13 on the extension portions 12$n$ and 12$p$, respectively.

A second epitaxial growth layer is determined in its formation position by a sidewall spacer 13 so as to be selectively formed. Source/drain regions 10$n$ and 10$p$ are formed, on portions of the extension portions 12$n$ and 12$p$ which are not covered with the sidewall spacers 13, from the second epitaxial growth layers, respectively. The source/drain region 10$n$ functions as a part of the source or drain of the NMOS transistor, and contains N-type impurities introduced thereinto. The source/drain region 10$p$ functions as a part of the source or drain region of the PMOS transistor, and contains P-type impurities introduced thereinto.

In addition, silicide layers 14$n$, 14$p$, and 15$n$, 15$p$ as alloy layers are formed on the gate electrodes 5$n$ and 5$p$, and the source/drain regions 10$n$ and 10$p$, respectively, through a Self-aligned silicide (Salicide) process in which the sidewall spacers 13 and the STI 2 are used as a separating layer.

The whole surface of the transistors is covered with an interlayer insulating film 20. While not especially illustrated, a connecting layer connected to the source/drain regions 10$n$ or 10$p$ is buried in the interlayer insulating film 20, and a wiring is formed on the interlayer insulating film 20.

In this embodiment, a distance between the gate electrode 5$n$ (or 5$p$) and the source/drain region 10$n$ (or 10$p$) is optimized by the concentration and the thicknesses of the extension portions 12$n$ and 12$p$, and the width of the sidewall spacer 13. In addition, this optimization realizes reduction of a source resistance and a drain resistance, suppression of a leakage current caused to flow through the source/drain region, and reduction of a parasitic capacity. For the reduction of the parasitic capacity, the gate side end portions of the extension portions 12$n$ and 12$p$ are provided with the inclined end faces. The inclined end faces are covered with the sidewall spacers 13, respectively, thereby reducing the parasitic capacity in the gate and the source region, or the gate and the drain region.

The extension portions 12$n$ and 12$p$ are layers for supplying currents to portions (effective channel regions), right under the gates, of the wells 3$n$ and 3$p$, respectively. If there are no extension portions 12$n$ and 12$p$, the source/drain regions 10$n$ and 10$p$ must be made close to the respective effective channel regions. In this case, in particular, an electric field concentrates on the drain region side, so that the short channel effect becomes remarkable, and the leakage current increases. In addition, the depletion layer largely extends into the channel current path, so that the carriers are exhausted and the channel resistance increases in a portion where the carriers are exhausted. In addition, when the speed of the channel traveling carriers reaches the saturation speed in that portion, this limits the on current value.

In this embodiment, the presence of the extension portions 12n and 12p makes it possible to separate the source/drain regions 10n and 10p from the respective effective channel regions. Each of the extension portions 12n and 12p is formed from an epitaxial layer containing N-type or P-type impurities introduced thereinto, and has the so-called raised extension structure. In this embodiment, each of the extension portions 12n and 12p has lower impurity concentration than that of the source/drain region 10n or 10p. However, from a viewpoint of reduction of the resistance value, each of the extension portions 12n and 12p may have impurity concentration equal to or higher than that of the source/drain region 10n or 10p.

Incidentally, when the extension portion is formed by utilizing the ion implantation method, the impurity concentration distribution has a slope in the depth direction, and thus a steep PN junction is hardly formed in the boundary between the extension portion and the substrate.

On the other hand, in the case of this embodiment, as will be described later, a steep PN junction is formed in an interface between the extension portion 12n or 12p and the substrate (the P-type well 3n or the N-type well 3p) by performing the impurity doping in the middle of the epitaxial growth for example (In-situ doping). As a result, the extension of the depletion layer from the extension portion 12n or 12p is suppressed.

In addition, the extension portions 12n and 12p are raised upward with respect to the substrate surface, whereby the depth of the PN junction from the well surface can be shallowed without increasing the series resistance of the extension portions 12n and 12p during application of the operating bias. As a result, it is possible to suppress the influence of the depletion layer extending from the extension portions 12n and 12p exerted on the effective channel region, and the concentration of the electric field.

Moreover, in this embodiment, each of the source/drain regions 10n and 10p is also formed from the epitaxial growth layer. Consequently, it is unnecessary to perform the anneal for activating the introduced impurities during the ion implantation at a temperature as high as 1,000° C. for example after formation of the extension portions 12n and 12p for which the steep PN junctions are required. As a result, the steep PN junctions can be maintained. It should be noted that while the substrate is heated during the second time epitaxial growth, the steepness of the PN junctions is substantially maintained since this heating temperature, for example, is equal to or lower than 700 to 800° C. and thus not so high as in the activation anneal.

The thickness of the second epitaxial growth layer (the source/drain regions 10n and 10p) is set to a value which is required to locate the lower surface of the silicide layer 15n or 15p upward with respect to the interface between the first epitaxial growth layer (the extension portion 12n or 12p) and the substrate even at the minimum. The thickness is set to such a value for the purpose of preventing an increase in junction leakage current.

As the result of the foregoing, in this embodiment, the short channel effect is suppressed, and an increase in leakage current and a local increase in channel resistance are prevented.

Next, a method of manufacturing the CMOS device according to an embodiment of the present invention will be described in detail with reference to the accompanying drawings.

FIGS. 2A to 20B are respectively cross sectional views of the CMOS device in the channel direction which is manufactured by applying a method of this embodiment.

Figure 2A:
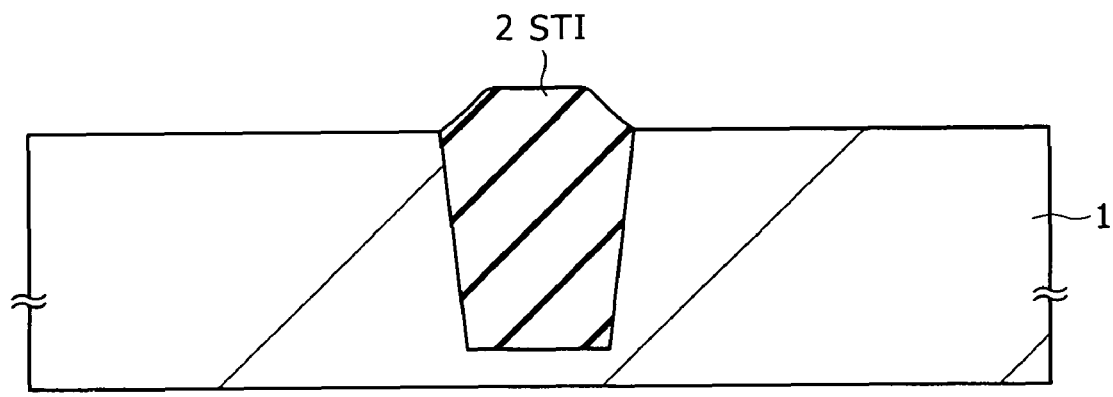
FIGS. 2A and 2B are respectively cross sectional views, of a CMOS device in a channel direction which is manufactured by applying a method according to an embodiment of the present invention, showing up to a process of forming an $SiO_2$ film used in ion implantation when a well is formed.

As shown in FIG. 2A, an STI 2 for isolation is formed in a substrate 1 by utilizing the known method.

Figure 2B:
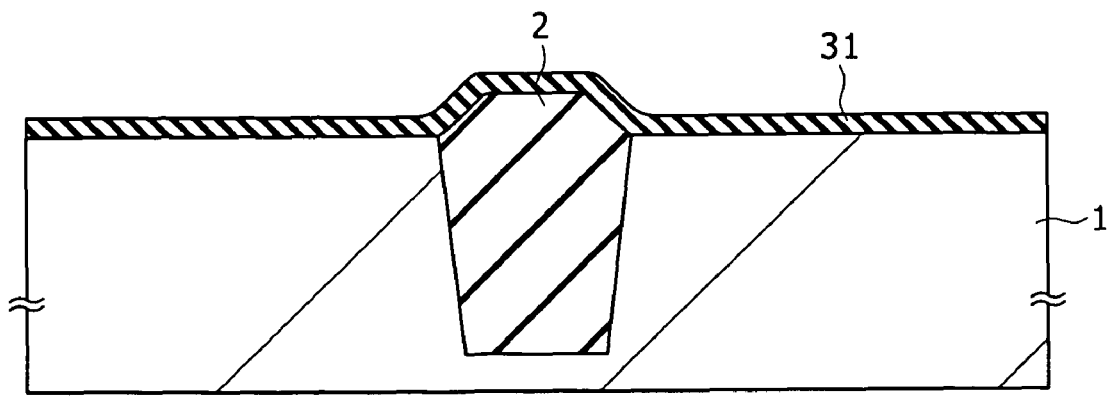

As shown in FIG. 2B, a silicon dioxide ($SiO_2$) film 31 as a protecting film for preventing a channeling when impurity ions are implanted into the silicon substrate 1 is formed on the silicon substrate 1 by utilizing the thermal oxidation method or the like.

Figure 3A:
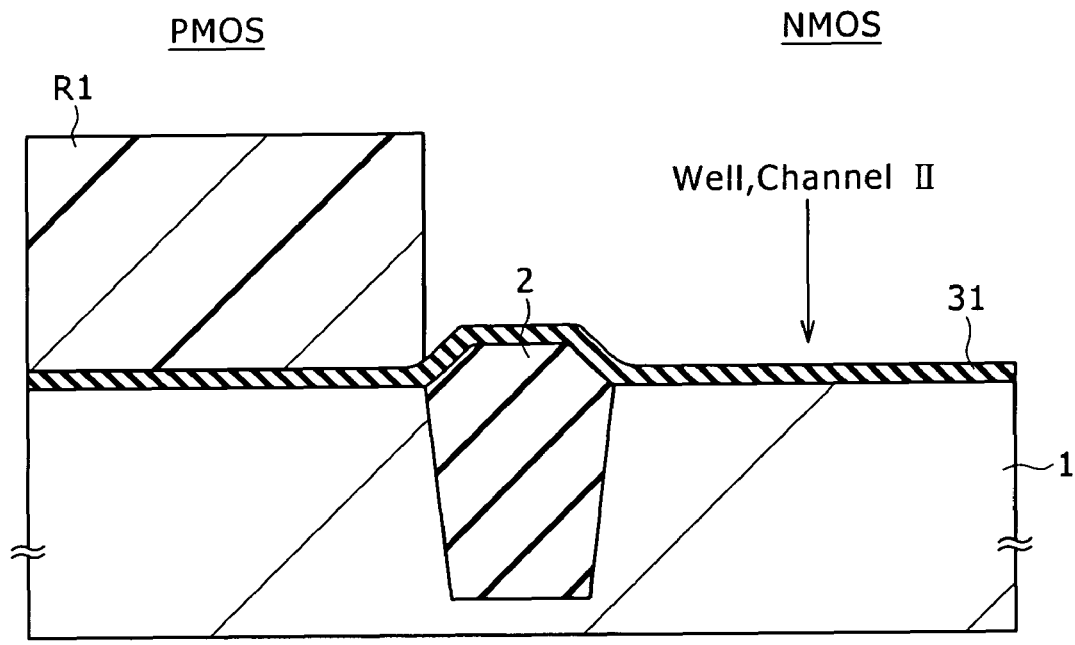
FIGS. 3A and 3B are respectively cross sectional views following the process shown in FIG. 2B and showing up to a process of implanting ions when an N-type well is formed.

As shown in FIG. 3A, a photo resist film R1 for protecting a PMOS transistor side is formed. Then, ion implantation (Well II) for forming a P-type well 3n (refer to FIG. 1) in the substrate 1 is performed, and if necessary, ion implantation (Channel II) for adjusting a threshold voltage is performed.

Figure 3B:
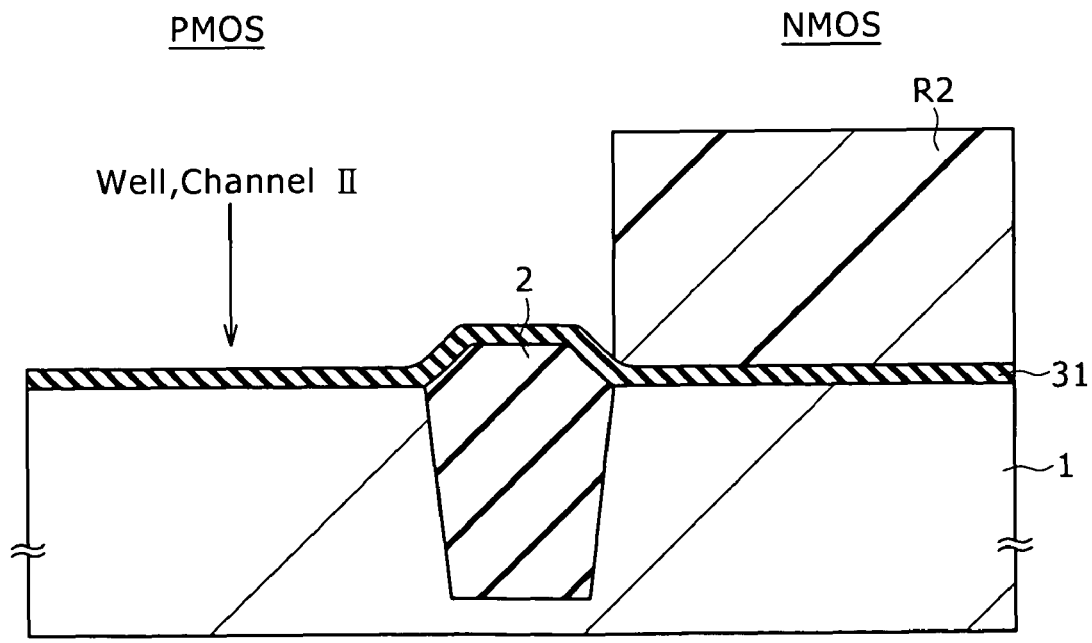

After the photo resist film R1 is removed, as shown in FIG. 3B, a photo resist film R2 for protecting an NMOS transistor side is formed, and similarly, ion implantation (Well II, Channel II) is performed.

Figure 4A:
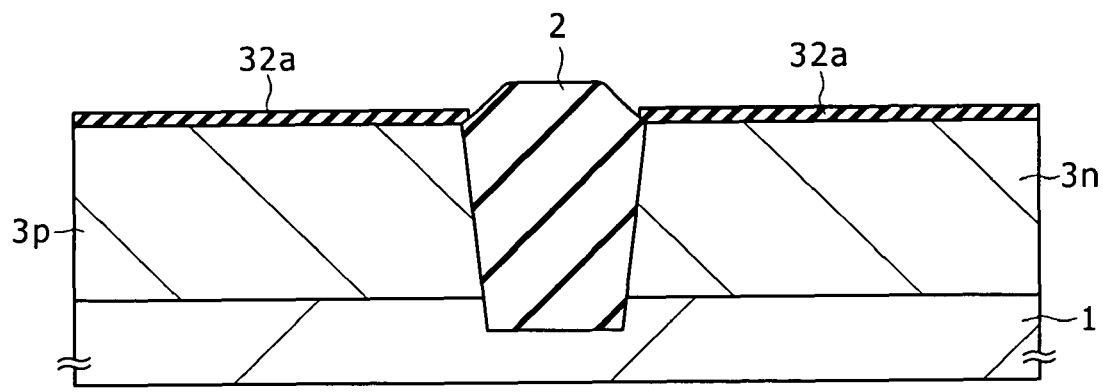
FIGS. 4A and 4B are respectively cross sectional views following the process shown in FIG. 3B and showing up to a process of forming a polysilicon film from which a dummy gate is formed.

When the activation anneal is performed after the photo resist film R2 is removed, as shown in FIG. 4A, a P-type well 3n and an N-type well 3p are formed on the NMOS transistor side and the PMOS transistor side, respectively. In the case of a Rapid Thermal Anneal (RTA) method for example, the activation anneal is performed at 1,010° C. for 10 seconds.

Subsequently, after the $SiO_2$ film 31 as the protecting film during the ion implantation is removed to expose the well surfaces, an $SiO_2$ film 32a having a thickness of about 0.1 nm to about 5 nm and becoming a dummy gate oxide film of a damascene gate is formed by utilizing the thermal oxidation method.

Figure 4B:
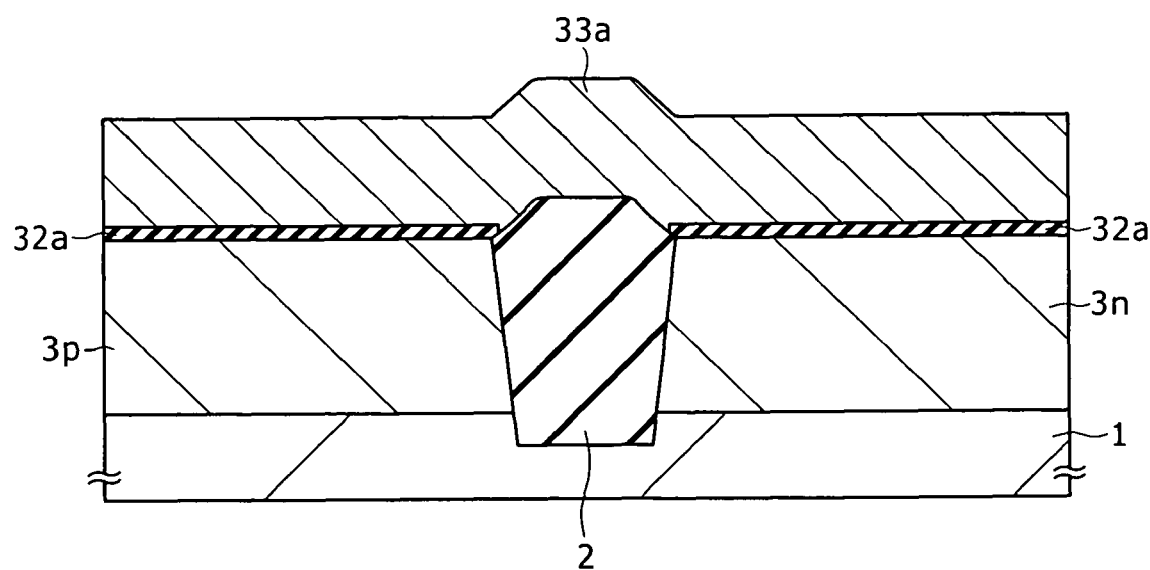

As shown in FIG. 4B, a polysilicon (Poly-Si) film 33a becoming the dummy gate of the damascene gate is formed on the $SiO_2$ film 32a by utilizing the CVD method. A thickness of the polysilicon film 33a falls within the range of about 100 nm to about 200 nm. An amorphous Si film or a doped amorphous Si film doped with impurities may also be formed instead of forming the polysilicon film 33a.

Figure 5A:
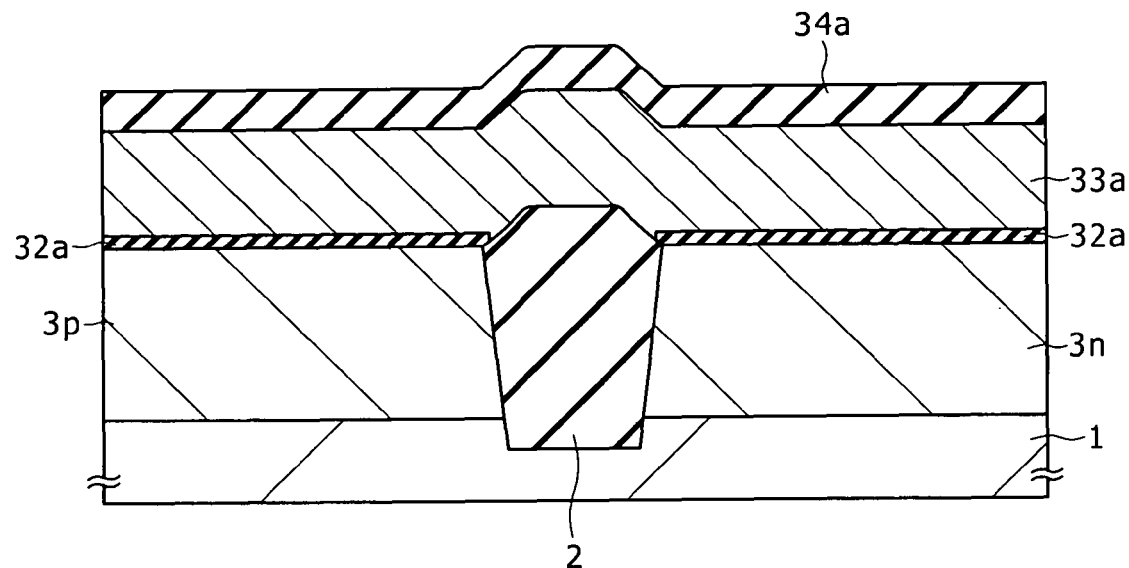
FIGS. 5A and 5B are respectively cross sectional views following the process shown in FIG. 4B and showing up to a process of forming a photo resist film onto which a pattern of the dummy gate is transferred, and an anti-reflection film.

A silicon nitride (SiN) film 34a becoming a Hard Mask when the dummy gate will be processed later through the etching process is formed on the polysilion film 33a by utilizing the CVD method (refer to FIG. 5A). A thickness of the SiN film 34a is selected from the range of 30 to 100 nm.

Figure 5B:
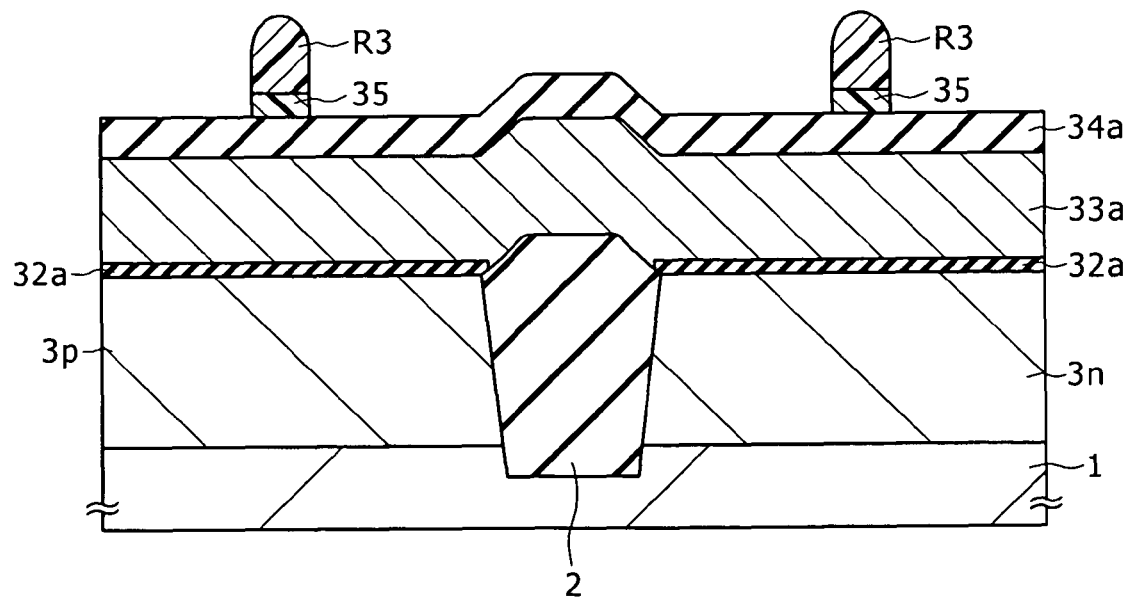

After an anti-reflection film and a photo resist film are formed on the SiN film 34a, the photo resist film is patterned through a photolithography process (using suitable one of the various kinds of exima lasers such as KrF, ArF and $F_2$) or the electron beam (EB) lithography process. Thus, the dry etching is performed with the photo resist film so patterned as a mask. As a result, as shown in FIG. 5B, the pattern of the photo resist film R3 corresponding to gate electrodes of the NMOS and PMOS transistors is transferred onto the anti-reflection film 35.

Subsequently, the SiN film 34a is dry-etched with both the photo resist film R3 and the anti-reflection film 35 as a mask.

Figure 6A:
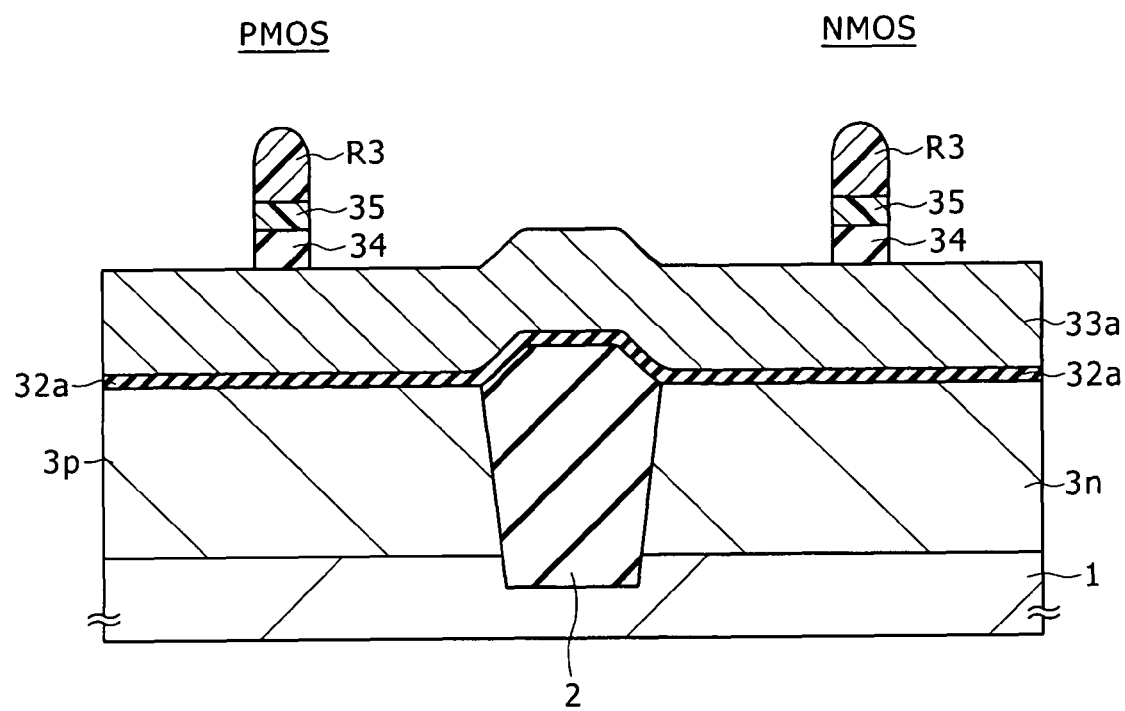
FIGS. 6A and 6B are respectively cross sectional views following the process shown in FIG. 5B and showing up to a process of forming the dummy gate through patterning.

As a result, as shown in FIG. 6A, a hard mask 34 which has a pattern corresponding to the gate electrodes of the NMOS and PMOS transistors is formed on the polysilicon film 33a. The hard mask 34 may be slimmed or trimmed so as to be finer than a line width (a line width of the photo resist film R3 shown in FIG. 5B) of the initial pattern of the photo resist film R3 by adjusting an amount of over-etching at this time. This process is performed for the purpose of making the gate length of the transistor finer than the gate line width determined by the mask pattern.

Figure 6B:
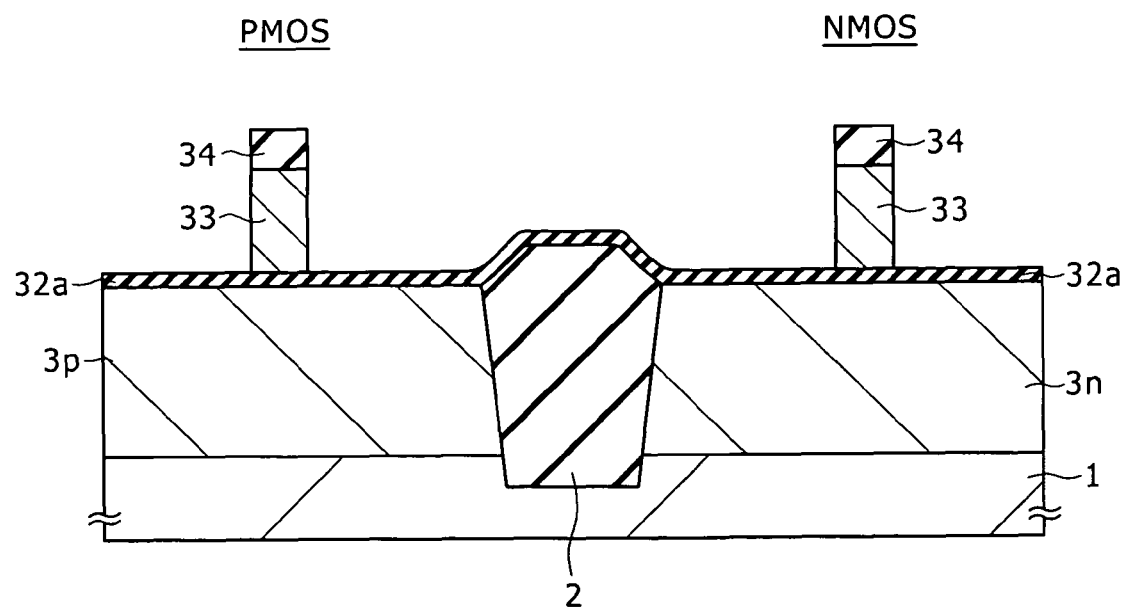

After the photo resist film R3 is removed, the polysilicon film 33a is dry-etched with the hard mask 34 as a mask. FIG. 6B shows a dummy gate 33 formed after completion of the dry etching and the hard mask 34. The line width of the dummy gate 33 at this time falls within the range of several nanometers to more than ten nanometers at the minimum.

Up to processes shown in FIGS. 7A to 13A relates to formation of extension portions 12n and 12p by the Selective Epitaxy.

In general, the growth of Si by the selective epitaxy does not occur on the surface of the insulating film, but occurs on the exposed surface of Si. For this reason, this embodiment proposes a method in which the selective epitaxy is performed in a state in which one of the PMOS transistor side and the NMOS transistor side is protected with an insulating film, and thereafter, the selective epitaxy is performed in a state in which the other is protected with an insulating film.

Figure 7A:
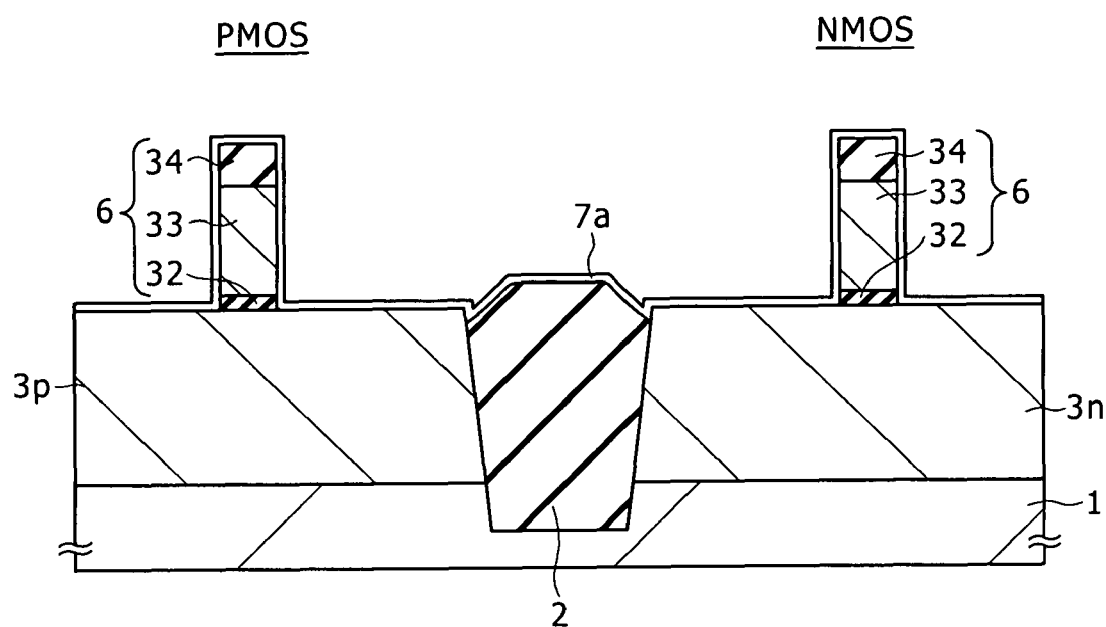
FIGS. 7A and 7B are respectively cross sectional views following the process shown in FIG. 6B and showing up to a process of forming a photo resist film for protecting a PMOS transistor side.

Firstly, the $SiO_2$ film 32a by which the dummy gate 33 is surrounded is removed. As a result, as shown in FIG. 7A, a dummy stack 6 consisting of the dummy gate oxide film 32, the dummy gate 33 and the hard mask 34 is formed.

Subsequently, an insulating film (an SiN film 7a in this embodiment) for protecting a place which is not desired to be subjected to the selective epitaxy is formed by utilizing the CVD method. A thickness of the SiN film 7a is in the range of 1 to 10 nm. The dummy stack 6 is perfectly coated with the SiN film 7a. A film having a lower wet etching rate than that of a film such as an $SiO_2$ film (a Ge oxide film in the case of a Ge substrate) which is formed by naturally oxidizing the surface of the substrate needs to be used as the material for the protecting film.

Figure 7B:
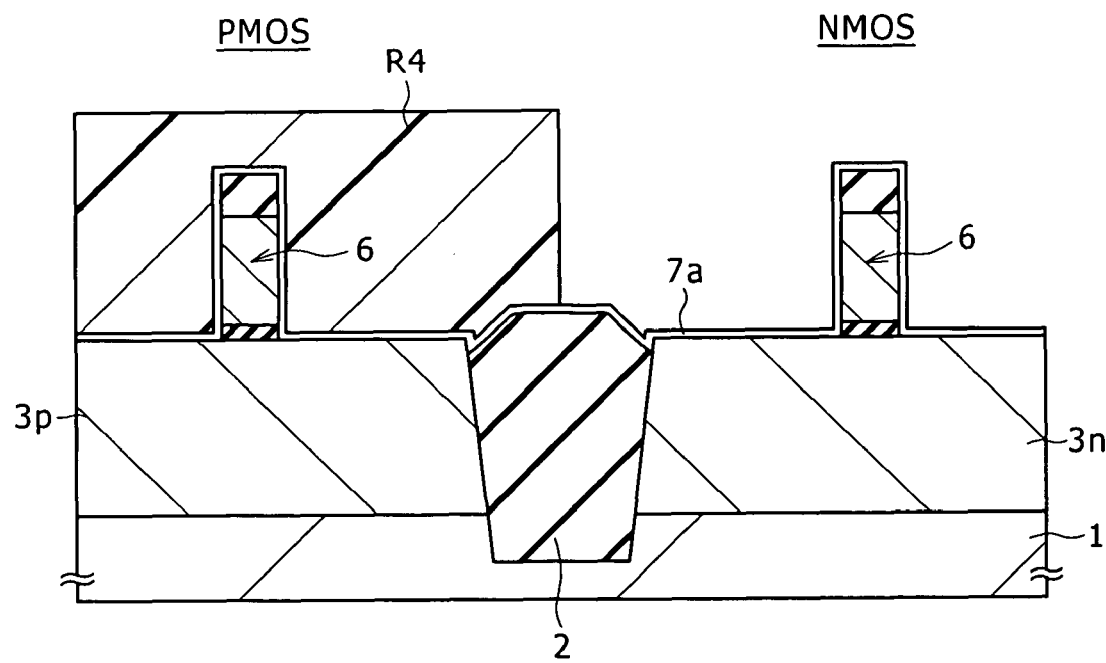

As shown in FIG. 7B, a photo resist film R4 for protecting the PMOS transistor side is formed on the SiN film 7a.

Figure 8A:
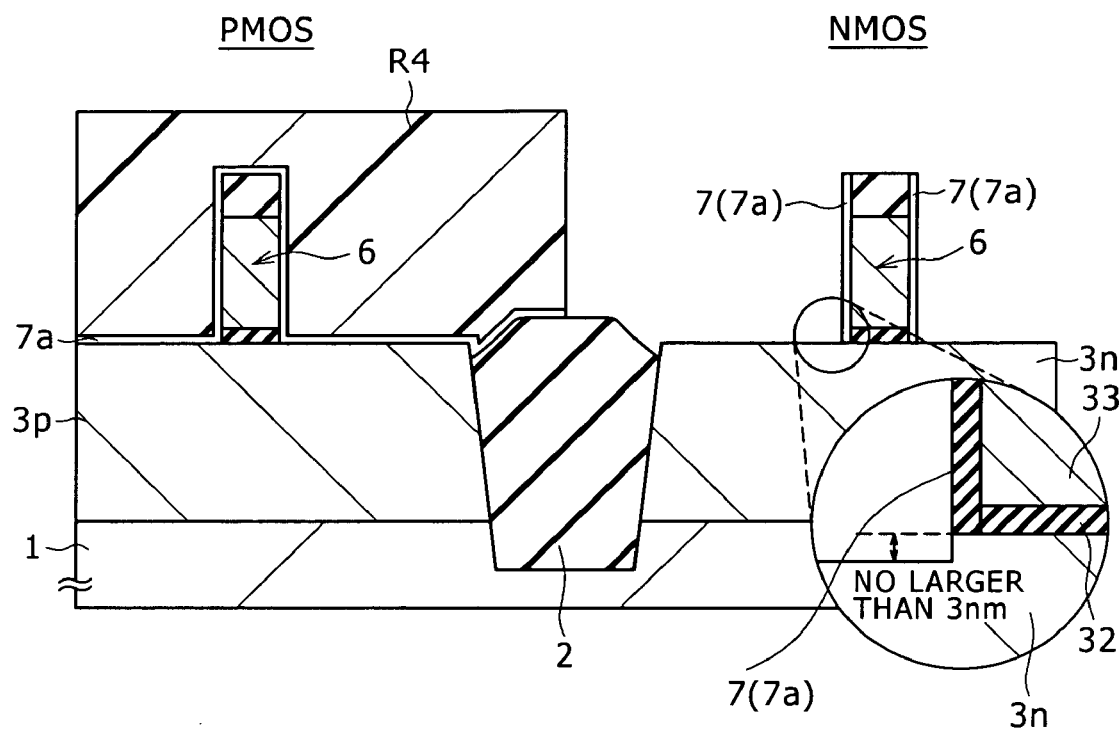
FIGS. 8A and 8B are respectively cross sectional views following the process shown in FIG. 7B and showing up to a process of removing the photo resist film.

When the anisotropic etching is performed with the photo resist film R4 as a mask, as shown in FIG. 8A, the SiN film 7a is left on side faces of the dummy stack 6, whereby an isolation insulating film 7 is formed, and the SiN film 7a on the wall is removed. However, the PMOS transistor side protected with the photo resist film R4 is covered with the SiN film 7a.

At this time, as shown in the form of a partially enlarged view in FIG. 8A, a dug portion is caused on the surface of the P-type well 3n through the anisotropic etching process in some cases. A depth of the dug portion is preferably designed so as to be equal to or smaller than 3 nm. If the depth of the dug portion is larger than this value, a depth of a PN junction formed between an impurity distribution region obtained through epitaxy in and after a next process, and the P-type well becomes large with respect to the channel formation surface (the well surface right under the gate). This becomes one cause of an increase in short channel effect. Since this fact and the growth through the epitaxy do not have no connection with the depth of the dug portion, the amount of digging is preferably controlled especially in terms of the control as well for the inclined end face.

Figure 8B:
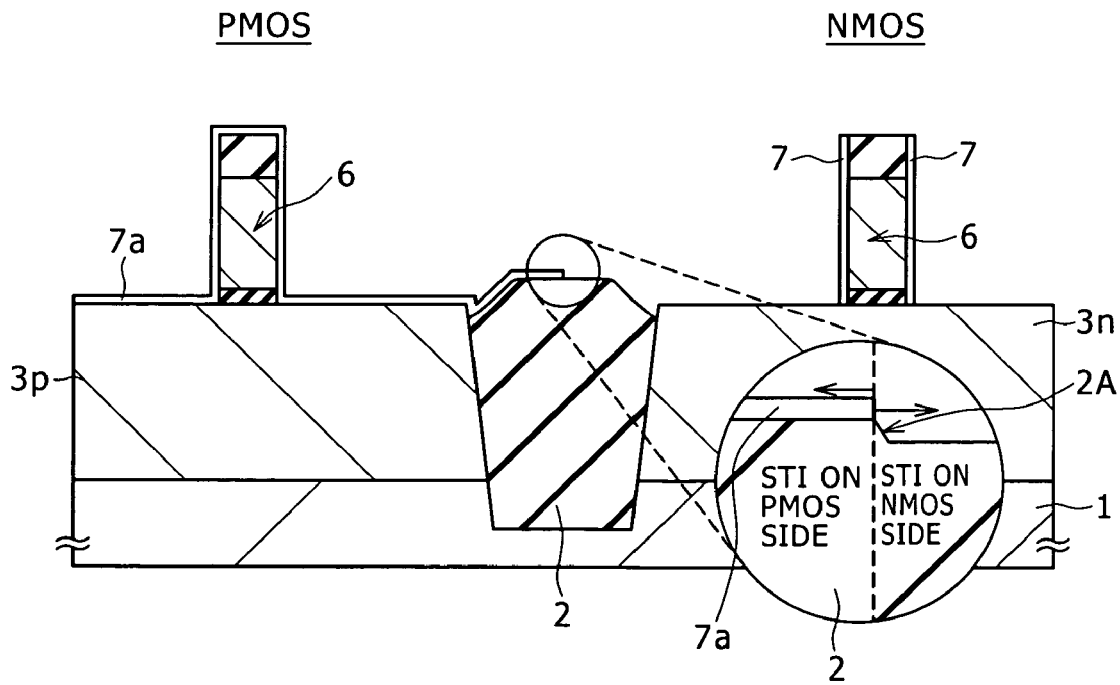

As shown in FIG. 8B, the photo resist film R4 is removed. After removal of the photo resist film R4, the amount of digging of the surface of the P-type well 3n needs to be suppressed to 3 nm or less. At this time point, as shown in the form of a partially enlarged view in FIG. 8B, a stepped portion 2A of the surface of the STI 2 is formed, outside an edge of the SiN film 7a on the STI 2, as a characteristic configuration when the selective epitaxy process using the protecting film (the SiN film 7a) is properly used.

Figure 9A:
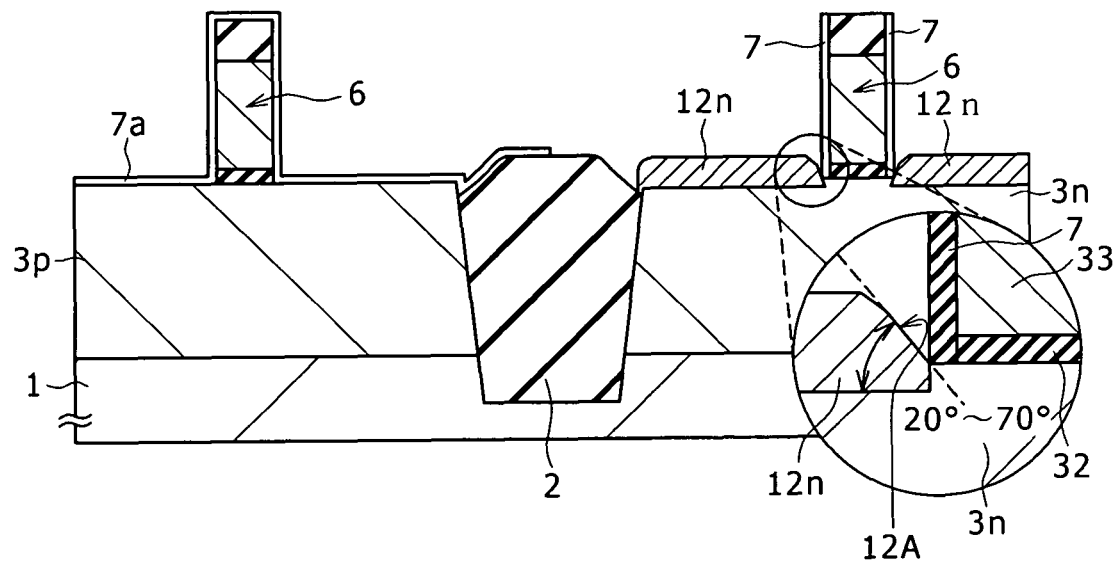
FIGS. 9A and 9B are respectively cross sectional views following the process shown in FIG. 8B and showing up to a process of forming an $SiO_2$ film.

As shown in FIG. 9A, a silicon layer (first epitaxial growth layer) mixed with an N-type impurity such as arsenic As or phosphorus P is formed on a surface of the P-type well 3n, on the NMOS transistor side, which is exposed by removing the SiN film 7a through the selective epitaxy process. A material of the first epitaxial growth layer is an Si monocrystal, or silicon Si and germanium Ge, carbon C or a mixed crystal thereof. The impurity concentration at this time is in the range of 1E18 to $1E20/cm^3$. The silicon layer containing this impurity is an N-type extension portion 12n of the NMOS transistor, and a portion having an important influence exerted on the transistor characteristics. Since the epitaxy is performed through a low temperature process at 800° C. or less, the impurity which is introduced into the silicon layer during its growth hardly diffuses into the silicon substrate (the P-type well 3n). As a result, it is possible to form a junction surface having a concentration difference with a steep gradient between the extension portion 12n and the P-type well 3n. Moreover, since the impurity is activated, it is unnecessary to perform the heat treatment for activation in the subsequent process, and thus it is possible to suppress the impurity diffusion into the substrate.

As a result, the short channel effect of the transistor can be suppressed while the extension portions each having a low resistance value are formed.

Since the extension portions 12n are formed through the selective epitaxy process, there is a feature in its configuration.

That is, as shown in the form of a partially enlarged view in FIG. 9A, since no epitaxial growth layer is formed on a side contacting the partition wall insulating film 7 in the exposed substrate surface in which the digging is slightly caused, in a side end portion of the dummy gate 33, an inclined end face 12A is formed in the extension portion 12 depending on the growth condition of the epitaxial growth layer (but, the amount of digging also slightly exerts an influence thereon). An angle (FASET) between the inclined end face 12A and the substrate surface takes a given value in the range of 20 to 70°. When this angle is too small, a parasitic resistance of the extension portion 12n increases. On the other hand, when this angle is too large, a parasitic capacity formed between the gate and the extension portion increases, or as will be described later, a margin when the gate electrode is stacked on the inclined end face becomes small. For this reason, this angle is preferably controlled so as to fall within that range.

Figure 9B:
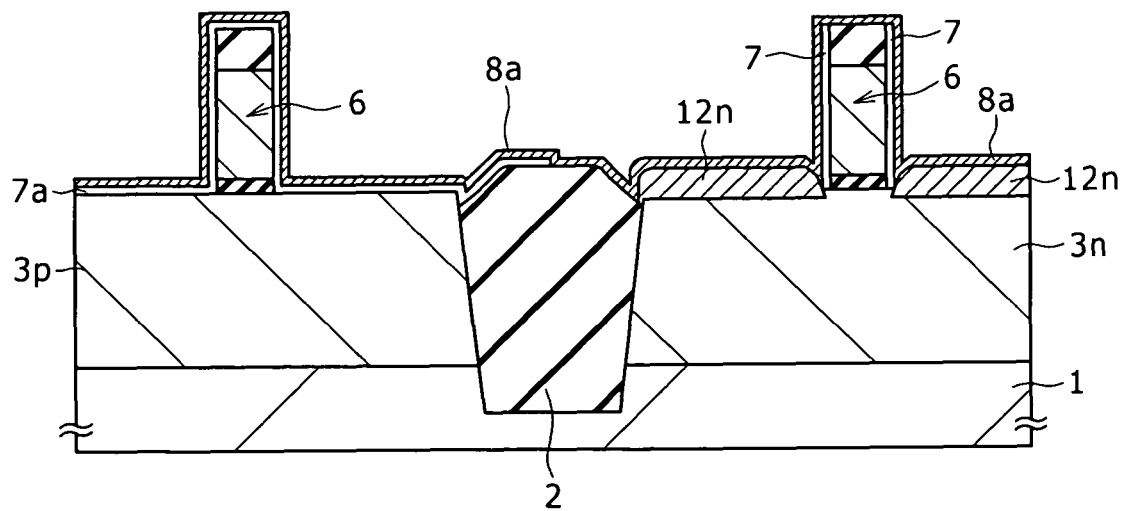
Figure 10A:
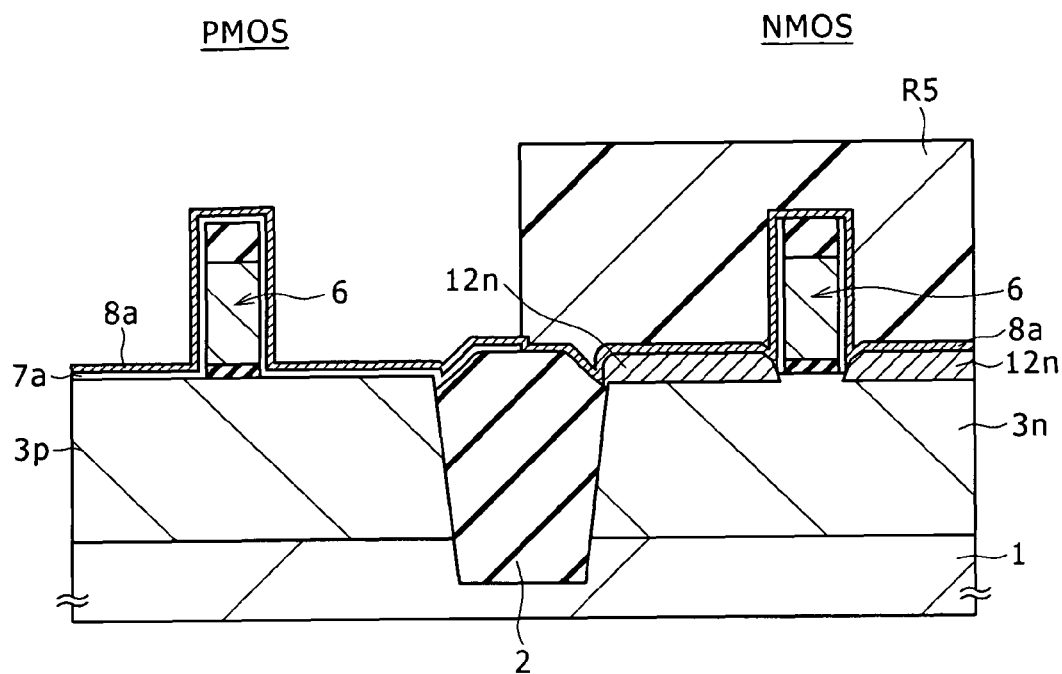
FIGS. 10A and 10B are respectively cross sectional views following the process shown in FIG. 9B and showing up to a process of forming a photo resist film for protecting an NMOS transistor side.
Figure 10B:
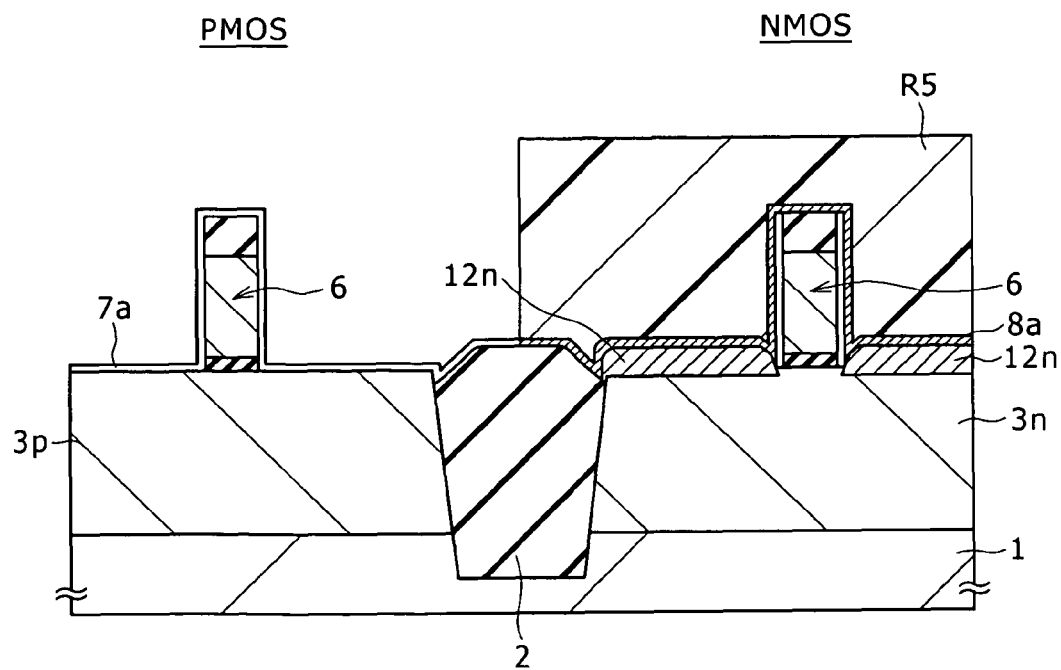

Next, in order to form an extension portion on the PMOS transistor side, as shown in FIG. 9B, a film for protecting the PMOS transistor side, e.g., an $SiO_2$ film 8a is formed. This film is laminated on the SiN film 7a on the PMOS transistor side. A film having a wet etching rate different from that of the SiN film 7a underlying this film, e.g., an $SiO_2$ film 8a needs to be used as this film.

In processes of FIGS. 10A to 12A, the processes of FIGS. 7B to 9B are repeated nearly in the same manner in a state in which a relationship between the side protected with the photo resist film and the side on which the selective epitaxy is performed is reversed from the above-mentioned case.

Figure 11A:
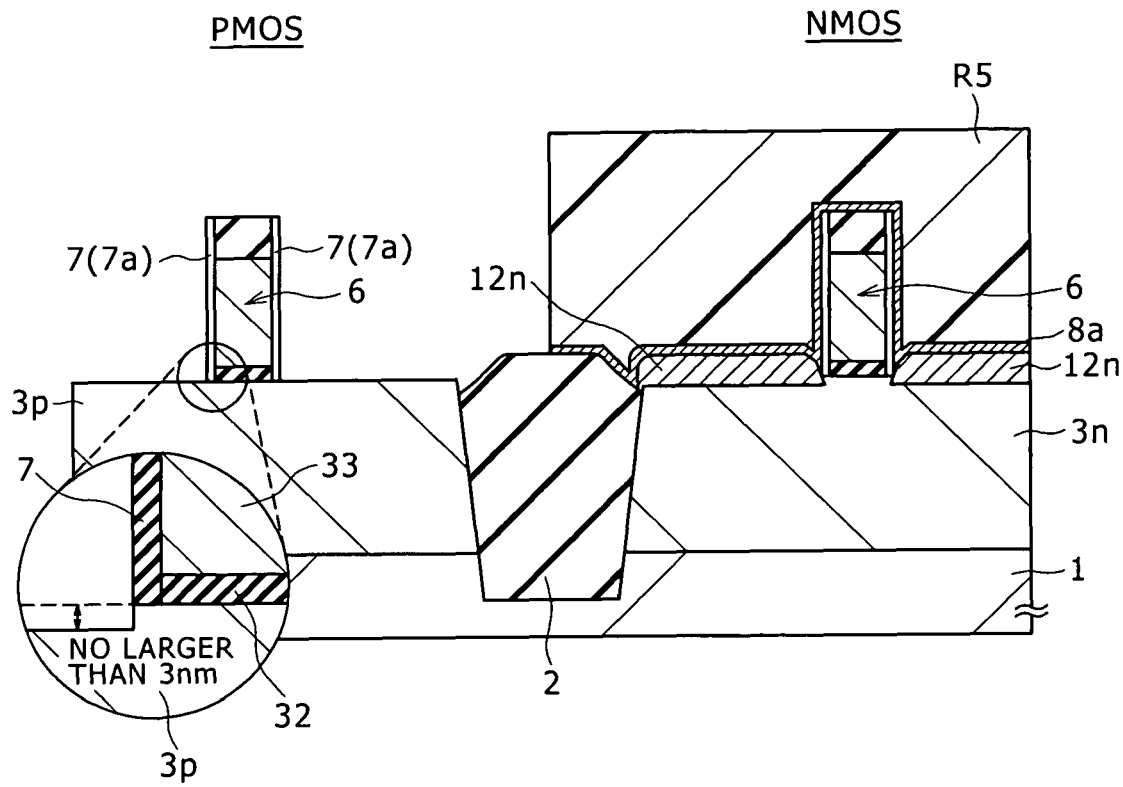
FIGS. 11A and 11B are respectively cross sectional views following the process shown in FIG. 10B and showing up to a process of removing the photo resist film.
Figure 11B:
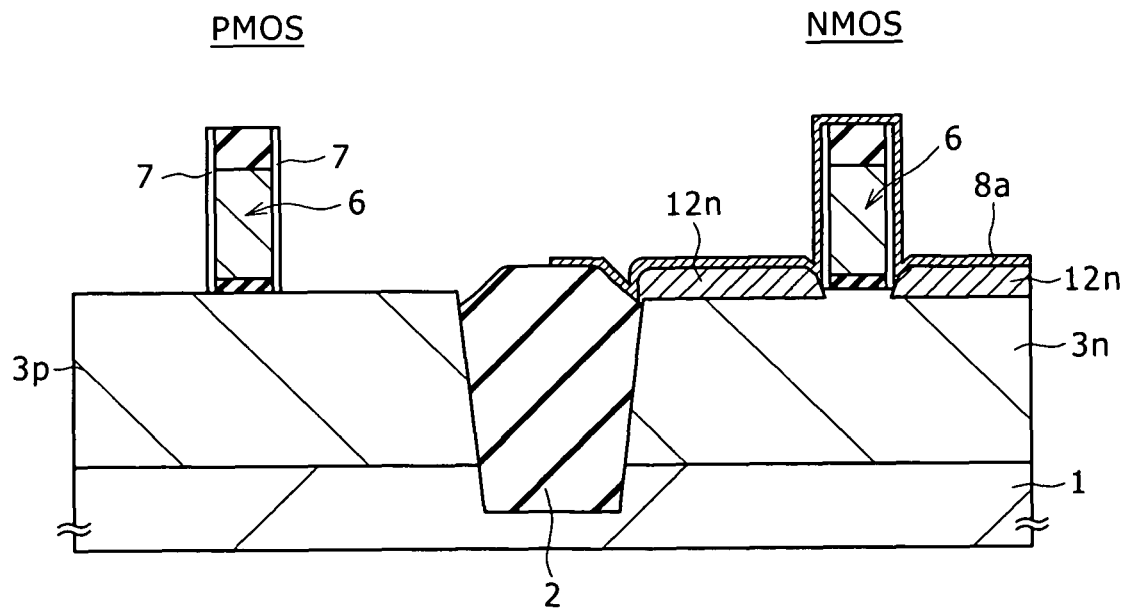

That is, firstly, a photo resist film R5 for protecting the NMOS transistor side is formed (refer to FIG. 10A), the $SiO_2$ film 8a on the PMOS transistor side is removed (refer to FIG. 10B), the SiN film 7a is etched by utilizing the anisotropic dry etching method to form a partition wall insulating film 7 on both side faces of the dummy stack 6 on the PMOS transistor (refer to FIG. 11A), and the photo resist film R5 is removed (refer to FIG. 11B). At this time, similarly to the case of the NMOS transistor side, an amount of digging of the silicon substrate is preferably suppressed to 3 nm or less. Next, a first epitaxial growth layer containing therein a P-type impurity such as boron B (or indium In in the case of a Ge substrate) is grown on the exposed surface of the silicon substrate on the NMOS transistor side through the selective epitaxy process, thereby forming extension portions 12p of the PMOS transistor (refer to FIG. 12A). At this time, since the NMOS transistor side is covered with the $SiO_2$ film 8a, no first epitaxial growth layer is formed on the NMOS transistor side. Similarly to the case of the NMOS transistor side, inclined end faces 12A each having an inclination angle (FASET) of 20 to 70° are formed in the P-type first epitaxial growth layer (the extension portion 12p).

Here, another feature in the manufacturing method of this embodiment is to form the extension portions 12p on the PMOS transistor side after formation of the extension portion 12n on the NMOS transistor side. Even in the case of application of the low temperature epitaxy process, the temperature of about 700° C. to about 800° C. is applied to the substrate. Thus, if the epitaxy process is formerly applied to the PMOS transistor side, there is the possibility that while the epitaxy process is thereafter applied to the NMOS transistor side, the light atoms such as boron B diffuse from the previously formed first epitaxial growth layer (the extension portions 12p) on the PMOS transistor side into the silicon substrate (the N-type well 3p). In the reverse case, though there is not no possibility that the n-type impurities diffuse into the P-type well 3n, since the P-type impurity such as boron B has a larger diffusion coefficient than that of the N-type impurity such as arsenic As or phosphorus P, in particular, the diffusion of boron B must be effectively suppressed. From this reason, the extension portions 12p on the PMOS transistor side is preferably formed after formation of the extension portions 12n on the NMOS transistor side.

Figure 12A:
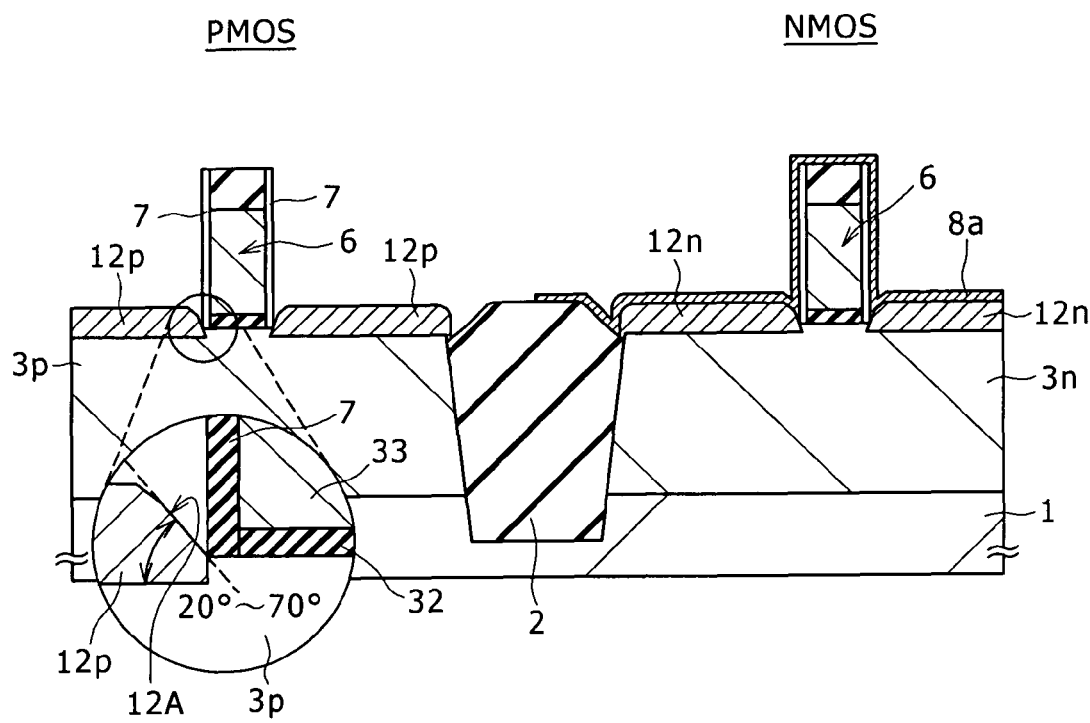
FIGS. 12A and 12B are respectively cross sectional views following the process shown in FIG. 11B and showing up to a process of removing an SiO$_2$ film.
Figure 12B:
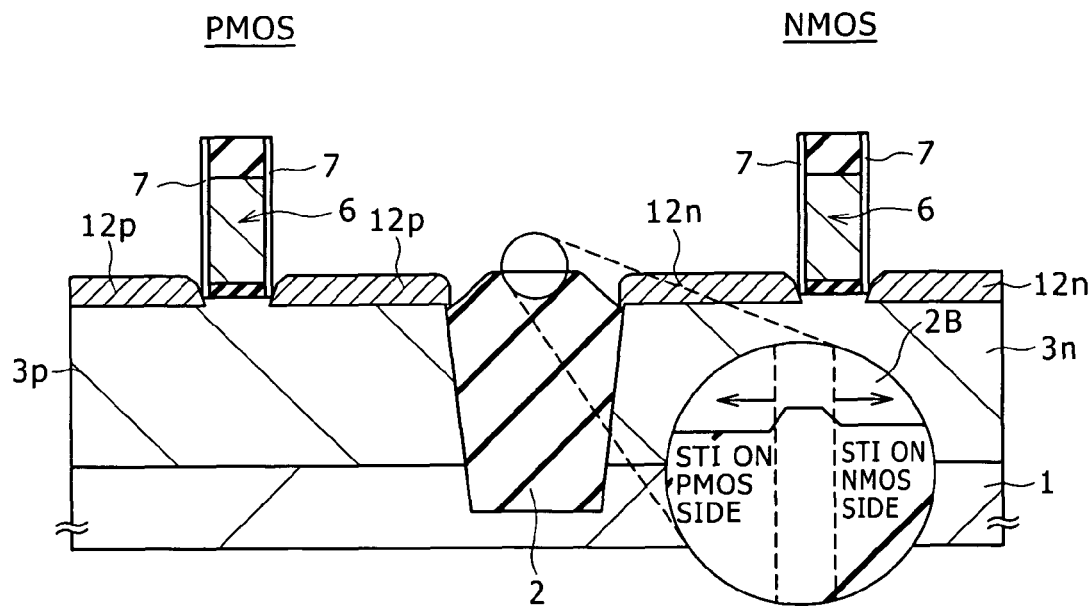

Thereafter, as shown in FIG. 12B, the $SiO_2$ film 8a is removed by the etching. At this time, the exposed surface of the STI 2 on the PMOS transistor side is also slightly etched.

Hence, when such a procedure is adopted, i.e., when the SiN film 7a on the PMOS transistor side and the SiN film 7a on the NMOS transistor side are separately anisotropically etched, and the formerly formed transistor side (the NMOS transistor side in this embodiment) is protected with the insulating film made of the same material as that of the STI 2, a projecting portion 2B having a width corresponding to a difference in edge position between the photo resist films R4 and R5 (corresponding to the total amount of retrocession of the two photo resist films R4 and R5 in directions opposite to each other when there is no alignment shift) is left on an upper surface of the STI 2. Also, differences corresponding to the film thickness of the $SiO_2$ film 8a and an over-etching amount thereof occur in the stepped portions on the both sides of the projecting portion 2B (in this embodiment, the difference becomes deeper on the PMOS transistor side). The formation of the projecting portion 2B is one of the configurational features when the NMOS and PMOS transistors are formed by utilizing this method.

Figure 13A:
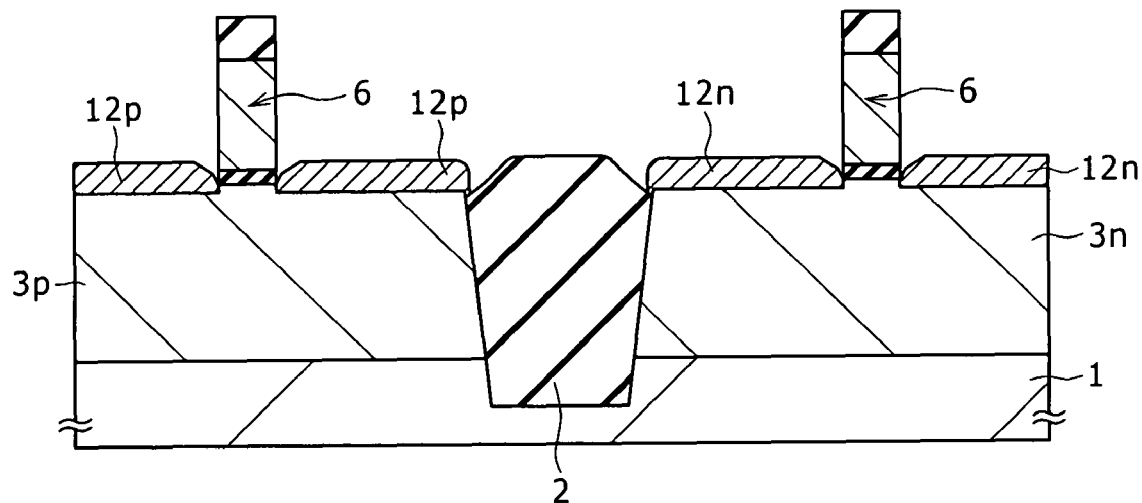
FIGS. 13A and 13B are respectively cross sectional views following the process shown in FIG. 12B and showing up to a process of forming an SiO$_2$ film as a sidewall insulating film.

As shown in FIG. 13A, the partition wall insulating films 7 which have protected the both side faces of the dummy stack 6 in each of the NMOS and PMOS transistor sides, respectively, is removed by utilizing a method in which the substrate 1 is dipped into a solution, such as a heated phosphoric acid, providing a high etching selectivity to the $SiO_2$ film.

In subsequent processes shown in FIGS. 13B to 15A, sidewall insulating films each having at least two layers (three layers in this embodiment) are formed on the both side faces of the dummy stack, respectively, in order to attain the purpose of stacking a damascene gate which will be formed later on the inclined end faces of the respective extension portions, and the purpose of making the sidewall insulating films a separating layer for a second epitaxial growth layer when a source/drain region is formed before that stacking.

Figure 13B:
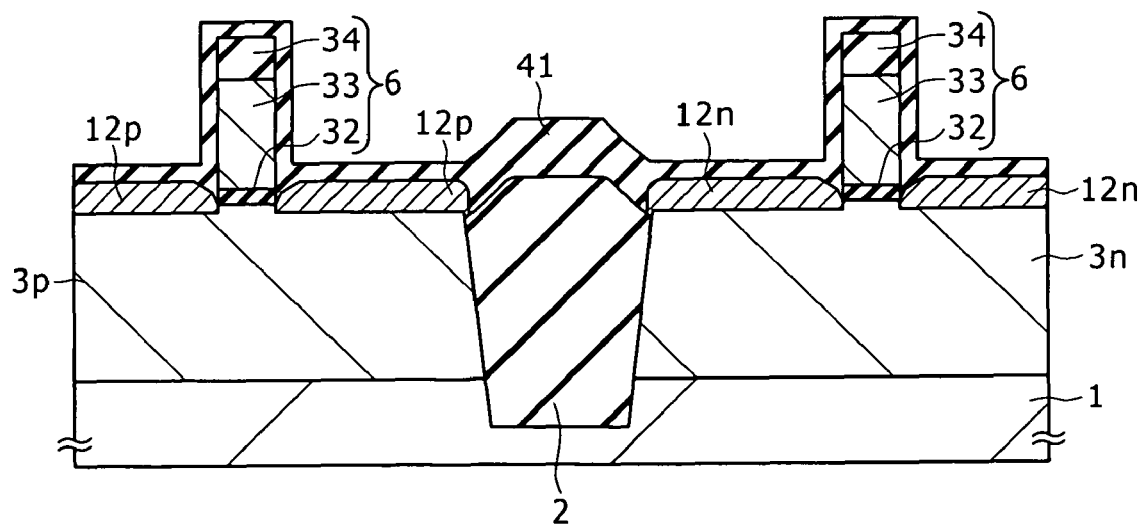

Firstly, as shown in FIG. 13B, a film made of a material having a much larger etching selectivity to the hard mask 34, e.g., an $SiO_2$ film 41 is formed so that the dummy mask 6 is perfectly covered with the $SiO_2$ film 41. The $SiO_2$ film 41 must be made thicker than the partition wall insulating film 7 which is removed in the process shown in FIG. 13A since the thickness of the $SiO_2$ film 41 regulates widths by which the gate electrodes 5n and 5p (refer to FIG. 1) are stacked on the inclined surfaces 12A of the extension portions 12n and 12p, respectively. The thickness of the $SiO_2$ film 41 is previously set in the range of 2 to 15 nm for example on the conditions of fulfilling this.

It should be noted that while the process needs to be changed, the $SiO_2$ film 41 may also be additionally formed on the partition wall insulating film 7 without removing the partition wall insulating film 7 in the process shown in FIG. 13A. In this case, it is not necessarily required to make the $SiO_2$ film 41 thicker than the partition wall insulating film 7.

Figure 14A:
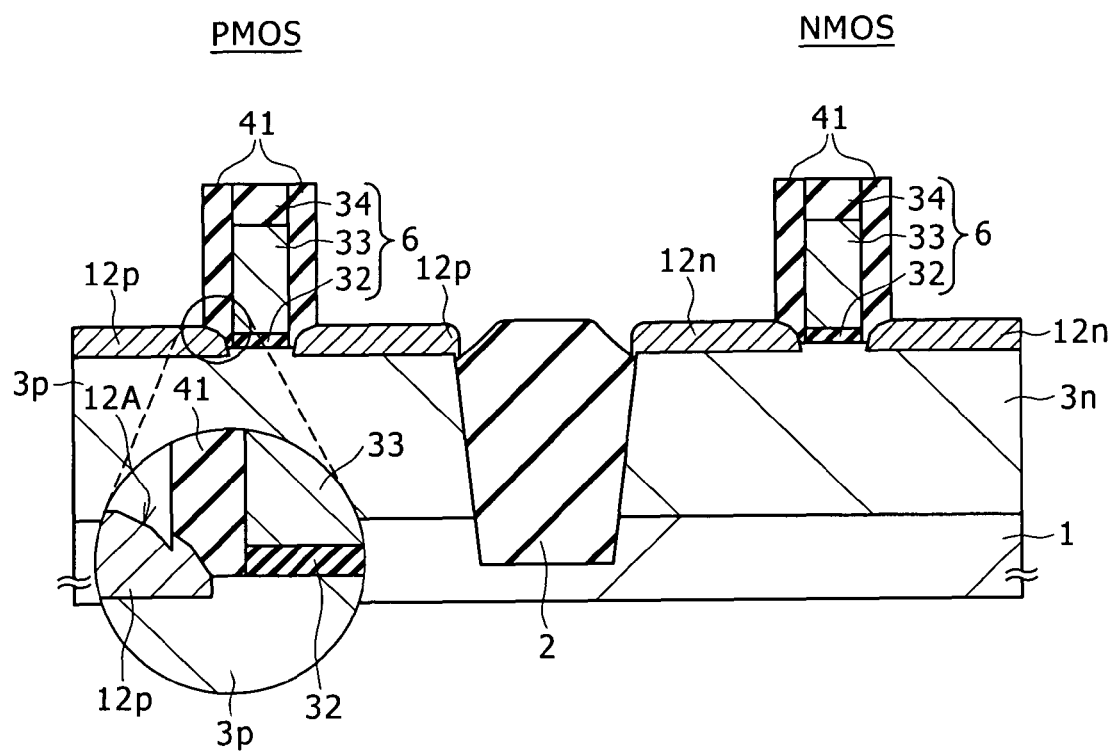
FIGS. 14A and 14B are respectively cross sectional views following the process shown in FIG. 13B and showing up to a process of forming an SiN film as a sidewall insulating film.

The full surface etching (etch back) is performed for the $SiO_2$ film 41 by utilizing the anisotropic dry etching method. As a result, as shown in FIG. 14A, the $SiO_2$ film 41 is left on the both side faces of the dummy stack 6, respectively. As shown in the form of a partially enlarged view in FIG. 14A, the dipping is caused in the inclined end faces 12A of the extension portions 12p on the PMOS transistor side by the over-etching during the etch back (this is also applied to the NMOS transistor side). Since this reduces the thickness of the extension portion to increase the resistance value of the extension portion, the digging amount (stepped portion depth) is preferably made equal to or smaller than 3 nm. The digging is one of the configurational features when the NMOS and PMOS transistors are formed by utilizing this method.

Figure 14B:
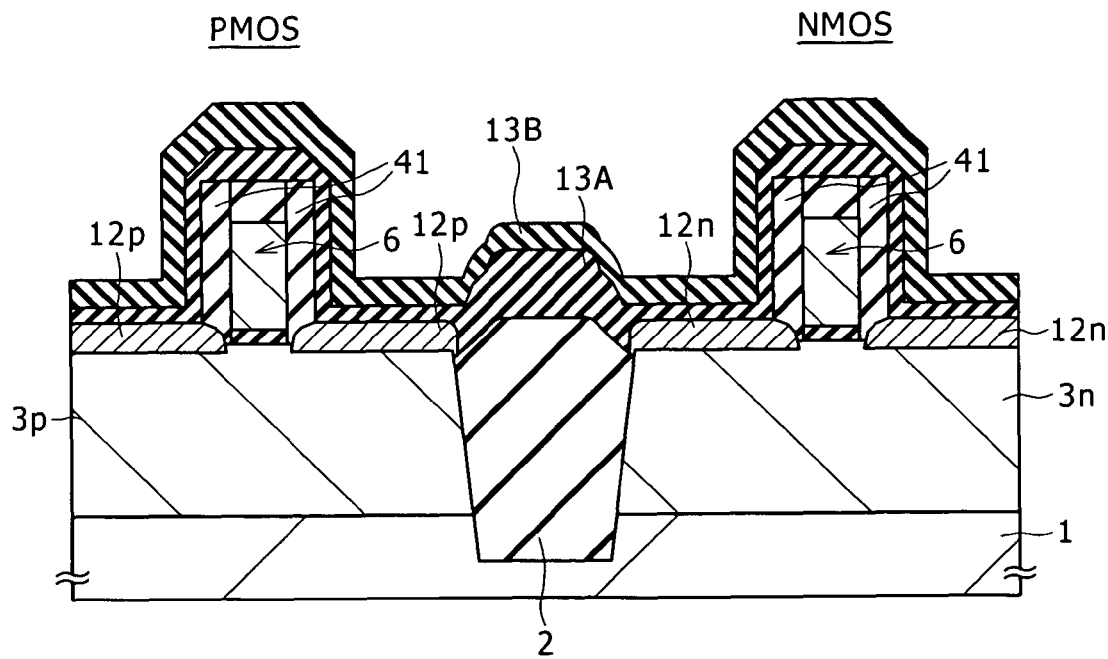

Next, as shown in FIG. 14B, a film having a much higher etching selectivity than that of the $SiO_2$ film 41 formed on the both sides of the dummy stack 6, respectively, e.g., an SiN film 13A is formed. Subsequently, a film having a much high etching selectivity as in the SiN film 13A, e.g., an $SiO_2$ film 13B is formed. Here, silicon nitride (SiN) is used as the material of the SiN film 13A in terms of that the film 13A is made function as an etching stopper for the $SiO_2$ film 41 for regulating the stacking width of the gate electrode on the extension portion, and that the film 13A withstands a hydrofluoric acid used in the pretreatment during formation of the second epitaxial growth layer to prevent the surface of the second epitaxial growth layer from retrogressing. However, the layer underlying the sidewall insulating film 7 may also be made of any other suitable material as long as that condition is fulfilled.

At that, the $SiO_2$ film 13B as the overlying layer may be omitted. However, in this embodiment, the $SiO_2$ film 13B is formed from relation to use of the SiN film 13A as the underlying layer from the above-mentioned reason. That is to say, when the sidewall spacer 13 (refer to FIG. 1) functioning as the separating layer during formation of the source/drain region is made of SiN, the parasitic capacity (fringe capacity) formed between the gate and the source or drain region may increase since a dielectric constant of SiN is large. In order to prevent this, in this embodiment, the relatively thin SiN film is formed at a minimum necessary thickness, and the $SiO_2$ film 13B having a relatively low dielectric constant is provided on the SiN film 13A for the purpose of preventing the capacity from increasing even when the difference between the gate electrode and the source/drain region is reduced.

Figure 15A:
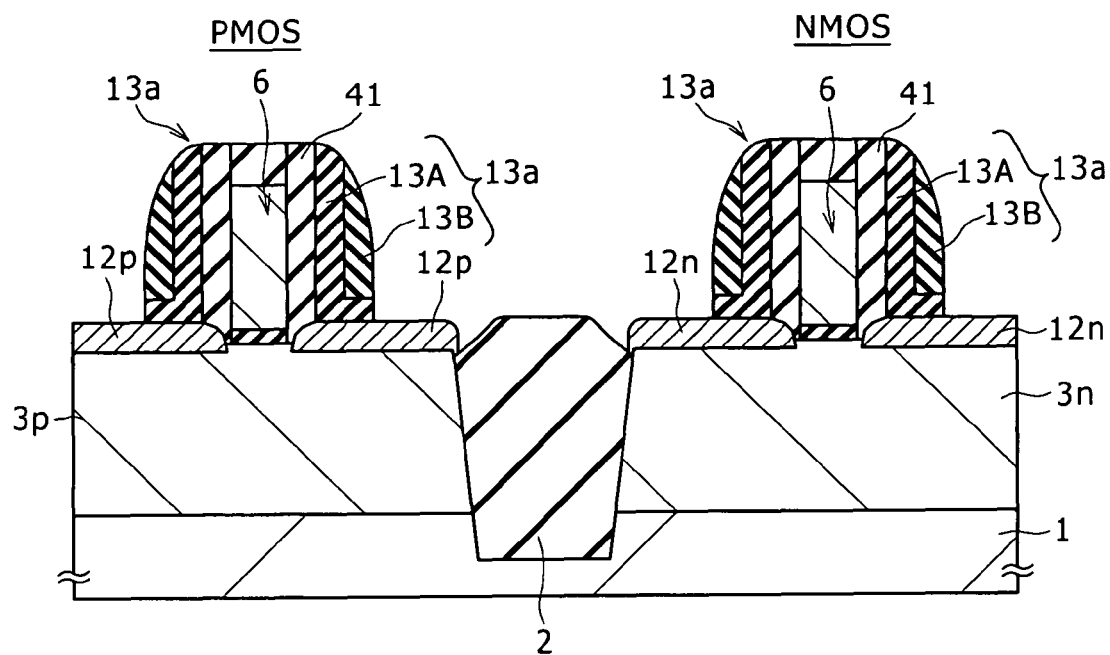
FIGS. 15A and 15B are respectively cross sectional views following the process shown in FIG. 14B and showing up to a process of forming a second epitaxial growth layer.

When the $SiO_2$ film 13B as the overlying layer and the SiN film 13A as the underlying layer are successively etched back by utilizing the anisotropic etching method, as shown in FIG. 15A, a sidewall spacer 13a of three layers including the inner $SiO_2$ film 41 which is formerly formed is formed. It should be noted that as shown in FIG. 1, the final sidewall spacer 13 has the two layers since the inner $SiO_2$ film 41 is removed.

When the anisotropy during the etch back is made high, the width of the sidewall spacer 13a is substantially determined as the thickness of the initially deposited film and thus becomes constant. As a result, its controllability is enhanced.

Figure 15B:
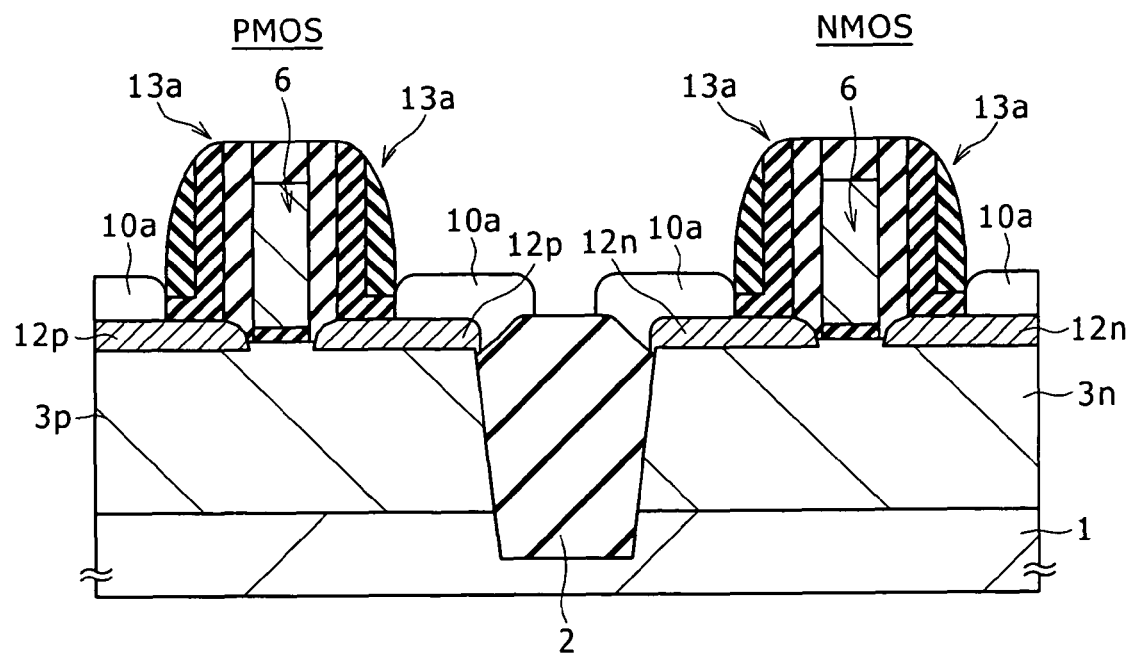

Next, the selective epitaxy for forming a second epitaxial growth layer becoming the source/drain region 10 (refer to FIG. 1) is performed. A material of the second epitaxial growth layer is a Si monocrystal, or silicon Si and germanium Ge, carbon C or a mixed crystal thereof. FIG. 15B shows a cross sectional view after completion of the selective epitaxy.

In the case where the second epitaxial growth layer 10a so formed is given a conductive property by the ion implantation, the thickness of the formed second epitaxial growth layer 10a is previously set to the value required to prevent the short channel effect from becoming remarkable due to the junction depth Xj from the silicon substrate surface even when the lower surface of the impurity concentration distribution is located upward with respect to the silicon substrate surface, or located downward with respect to the silicon substrate surface. At this time, when the depth of the ion implantation distribution is too shallow, the series resistance value of the source and drain regions increases. Hence, the optimal value of the thickness of the second epitaxial growth layer 10a is determined in view of the depth of the ion implantation distribution.

In addition, the thickness of the second epitaxial growth layer 10a is limited by the extent to which silicide layers 15n and 15p which will be formed later are formed. That is to say, when the lower surface of the ion implantation distribution does not reach the silicon substrate, it is necessary to cause the lower surfaces of the silicide layers 15n and 15p to be located upward with respect to the silicon substrate surface to prevent the junction leakage current from increasing. In addition, even when the lower surface of the ion implantation distribution is formed within the silicon substrate, it is necessary to cause the lower surfaces of the silicide layers to be located upward with respect to the lower surface of the ion implantation distribution. The lower limit of the thickness of the second epitaxial layer 10a is determined from a viewpoint of this.

Incidentally, a method of selectively implanting the P-type and N-type impurities with the photo resist film as a mask by performing the ion implantation twice in order to give the second epitaxial growth layer 10a the conductive property is not preferable since it requires the activation anneal at a temperature as high as 1,000° C.

A more preferable method, though the number of processes increases to some extent, may be realized by the In-situ doping in the individual selective epitaxies similarly to the method of forming individually the extension portions on the NMOS transistor side and the extension portions on the PMOS transistor side (refer to FIGS. 7A to 12B). This method has the advantage of obtaining the excellent transistor characteristics since the thermal diffusion is hardly caused from the previously formed extension portions 12n and 12p as compared with the method using the above-mentioned ion implantation.

Figure 16A:
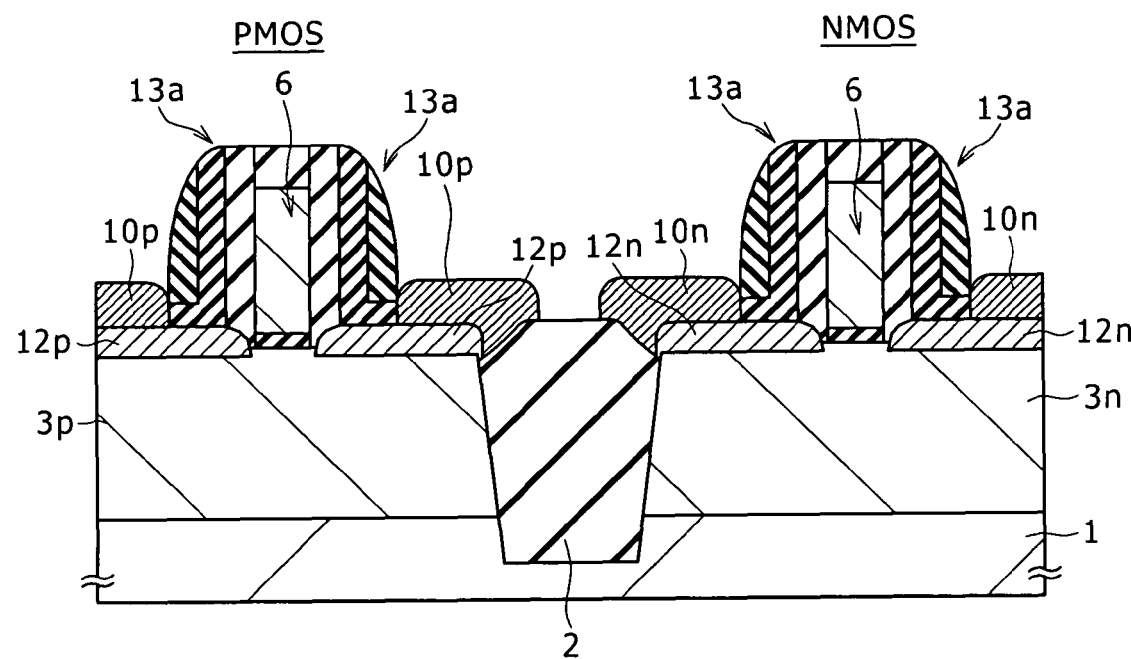
FIGS. 16A and 16B are respectively cross sectional views following the process shown in FIG. 15B and showing up to a process of forming a silicide layer on the second epitaxial growth layer.

FIG. 16A shows N-type source/drain regions 10n and P-type source/drain regions 10p which are obtained by giving the second epitaxial layer 10a the conductive property.

Figure 16B:
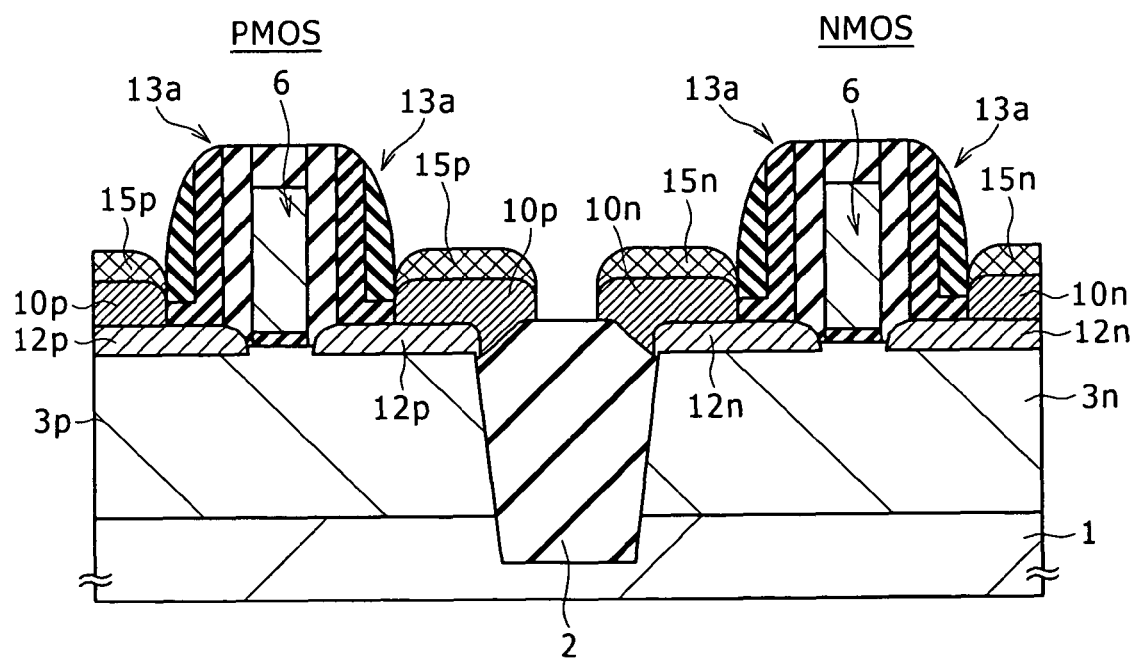

In a process shown in FIG. 16B, a silicide layer 15n is formed on the source/drain regions 10n, and at the same time a silicide layer 15p is formed on the source/drain regions 10p. Each of the silicide layers 15n and 15p is made of $CoSi_2$ or $NiSi_2$ for example. These silicide layers 15n and 15p are formed such that after formation of a metallic film made of cobalt Co or nickel Ni, a heat treatment is performed to alloy a portion of the metallic film contacting the semiconductor material, and an unalloyed portion (a portion contacting the insulating material) is removed by performing a chemical fluid treatment.

Figure 17A:
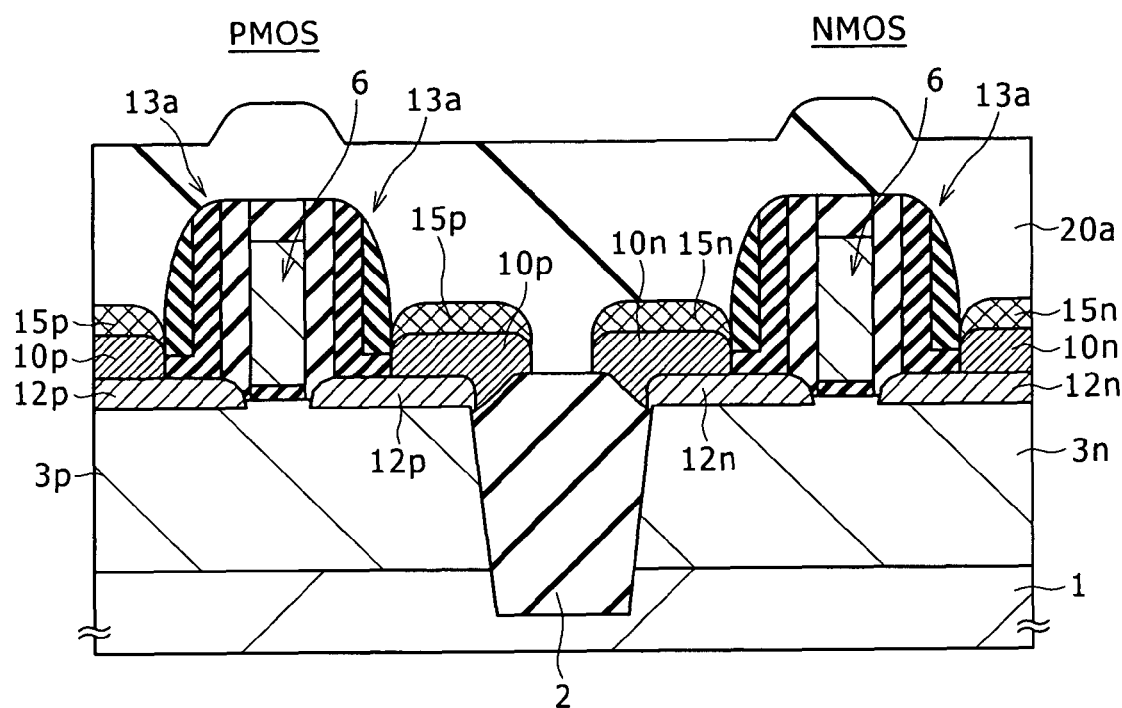
FIGS. 17A and 17B are respectively cross sectional views following the process shown in FIG. 16B and showing up to a process of etching an upper portion of an interlayer insulating film.
Figure 17B:
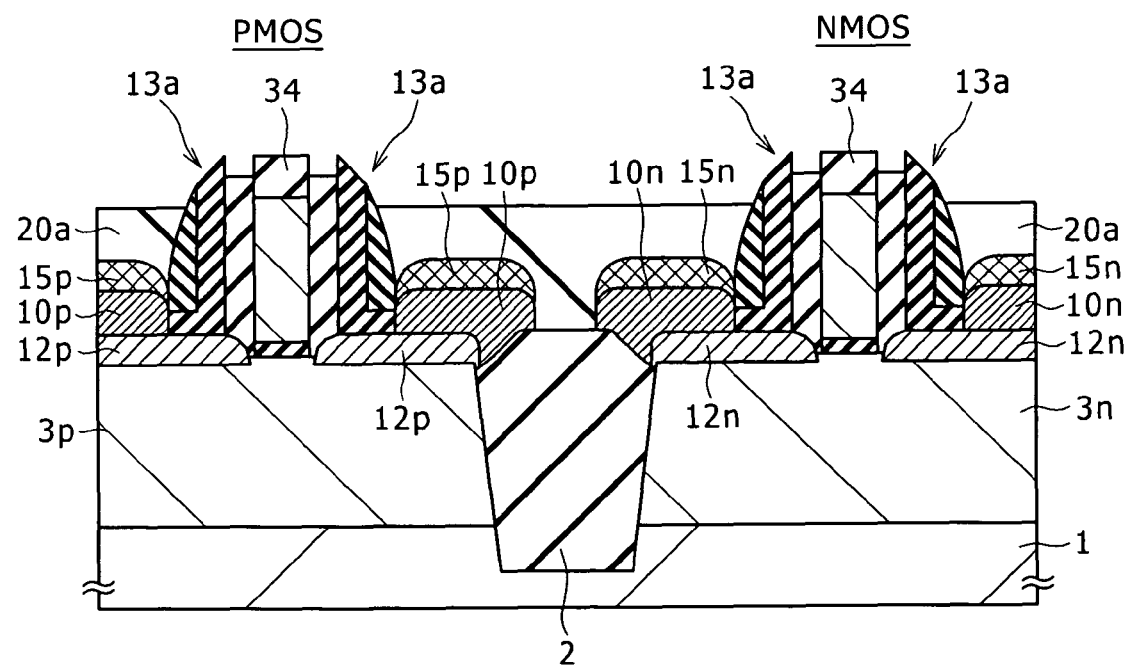

A part 20a of an interlayer insulating film 20 (refer to FIG. 1) is deposited (FIG. 17A), and its surface portion is etched back until the hard mask 34 is exposed. The interlayer insulating film 20a is an $SiO_2$ film which is formed by utilizing the plasma CVD method. FIG. 17B shows a device cross sectional view after completion of the etch back concerned. At this time, upper portions of the $SiO_2$ films of the two layers which are formed inside and outside the sidewall spacer 13a are slightly etched away.

Figure 18A:
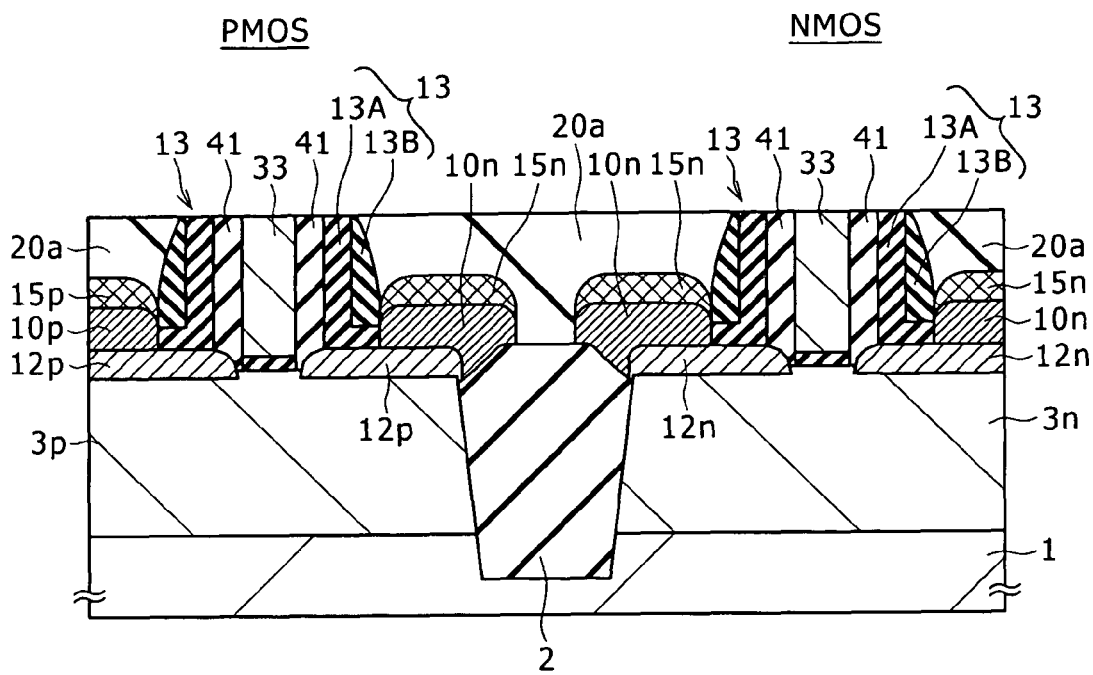
FIGS. 18A and 18B are respectively cross sectional views following the process shown in FIG. 17B and showing up to a process of removing the dummy gate.

At this time, upper portions of the SiN films (the hard mask 34 and the SiN film 13a) which are hardly etched away project from the surface of the interlayer insulating film 20a. The SiN films are flattened through a CMP process to remove their projecting upper portions. FIG. 18A shows a device cross sectional view after completion of the flattening process.

Figure 18B:
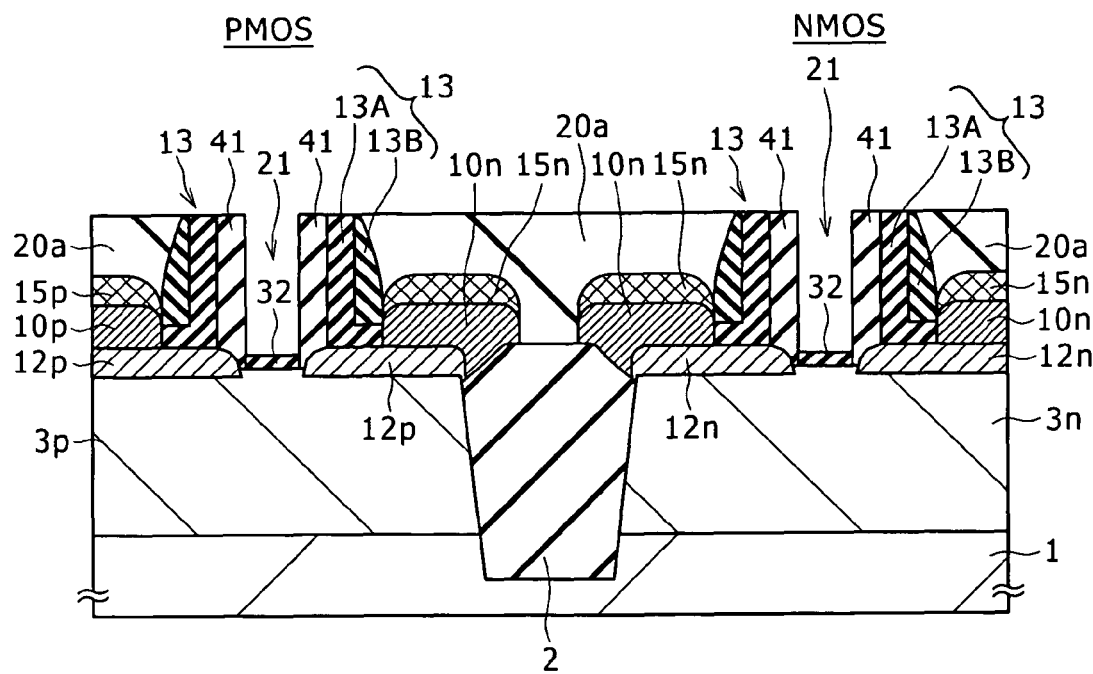

The dummy gate 33 exposed to the surface is removed by performing the etching. More specifically, the dummy gate 33 is removed by utilizing the wet etching method using an alkali solution such as a tetramethylammonium hydroxide (TMAH) aqueous solution, or the chemical dry etching method using a mixed gas of silane $CF_4$ gas and oxygen $O_2$ gas. FIG. 18B shows a gate opening portion 21 which is formed by performing this etching.

Figure 19A:
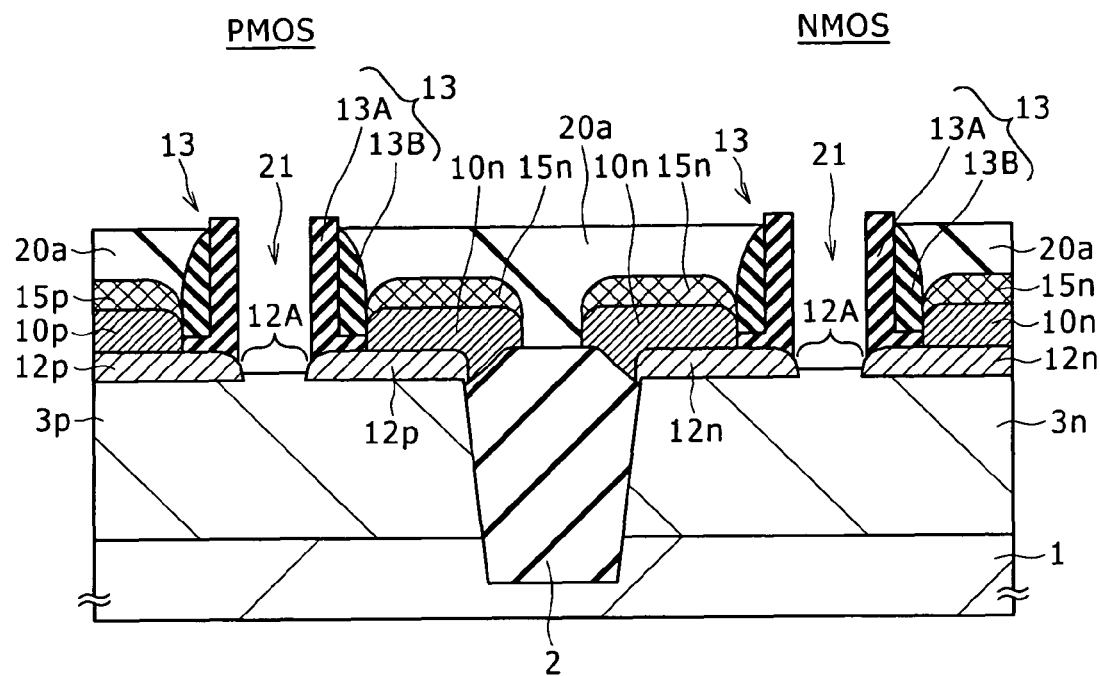
FIGS. 19A and 19B are respectively cross sectional views following the process shown in FIG. 18B and showing up to a process of forming a gate metal layer.

Subsequently, the $SiO_2$ film 41 and the gate oxide film 32 within the gate opening portion 21 are removed by performing the etching using a solution containing a hydrofluoric acid. As a result, as shown in FIG. 19A, the surface of the well (the P-type well 3n or the N-type well 3p) is exposed to the bottom surface of the gate opening portion 21. The inclined end faces 12A of the extension portions 12n or 12p are exposed to the bottom surface of the gate opening portion 21 through this etching process. At this time, an SiN film 13A functions as an etching stopper, and thus the exposed width of each inclined end face is controlled at a constant value.

Figure 19B:
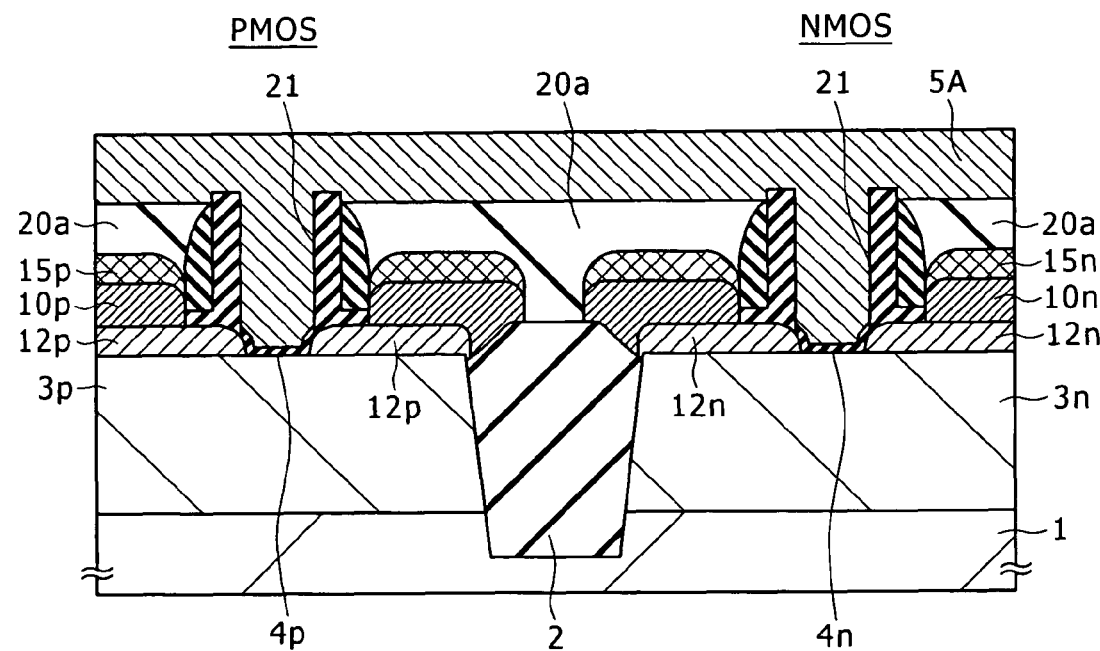

As shown in FIG. 19B, gate insulating films 4n and 4p are simultaneously formed on the wells and the inclined end faces 12A of the extension portions which are exposed within the gate opening portions 21, respectively. Each of the gate insulating films 4n and 4p is an $SiO_2$ film formed by the thermal oxidation, an SiON film formed by subjecting the $SiO_2$ film into the plasma nitriding, an $HfO_2$ film formed by utilizing the Atomic Layer Deposition (ALD) method, or the like.

When each of the gate insulating films 4n and 4p is formed by the oxidation, the oxidation speed increases in the silicon layer containing therein a lot of impurities. Normally, the impurity concentration of each of the extension portions 12n and 12p is higher than that of each of the P-type well 3n and the N-type well 3p. Hence, the thicker gate oxide film is formed in the extension portion, respectively. In this case, a coupling capacity between the gate and the extension portions becomes small. At that, when the formation of the accumulation layer is desired to be accelerated by increasing the coupling capacity, any other suitable film depositing method has to be selected.

Subsequently, as shown in FIG. 19B, a thick gate metal later 5A is formed to be filled in the gate opening portions 21. The gate metal layer 5A may be formed by utilizing only the PVD method, or by utilizing the PVD method for a Cu seed layer and the subsequent electroless plating of Cu.

Figure 20A:
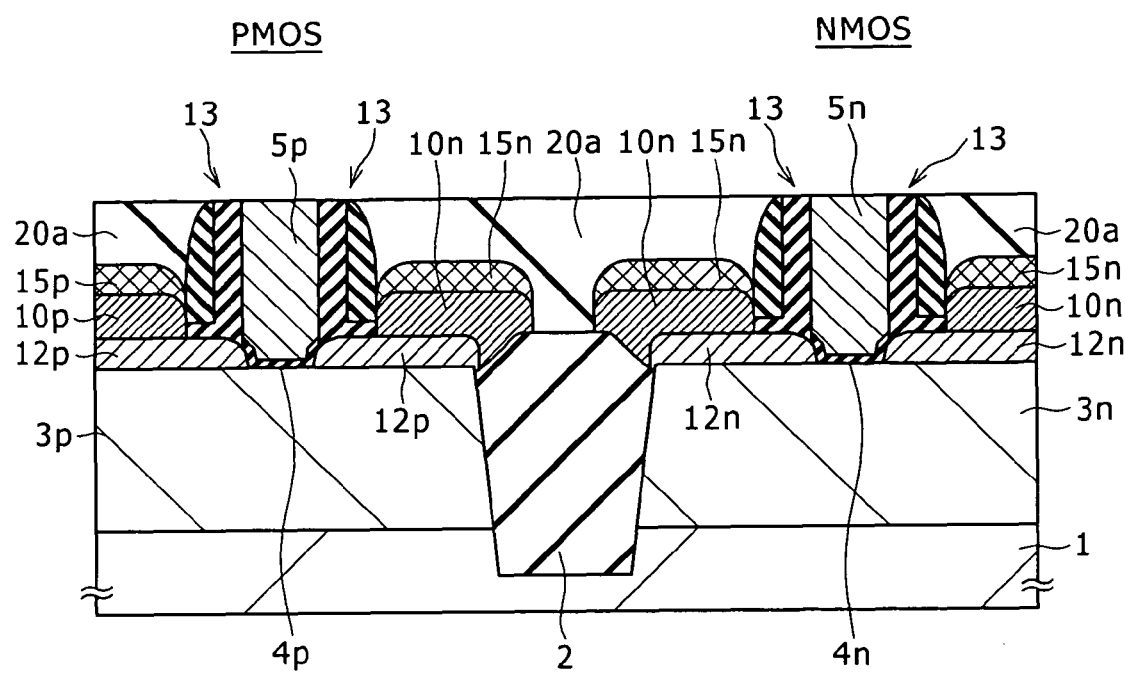
FIGS. 20A and 20B are respectively cross sectional views following the process shown in FIG. 19B and showing up to a process of forming a silicide layer on a gate electrode.

An excessive portion of the gate metal layer 5A is removed by utilizing the CMP method, so that the gate metal layer 5A is left only within the gate opening portion 21. As a result, as shown in FIG. 20A, the interlayer insulating film 20a, and gate electrodes 5n and 5p surrounded by the sidewall spacers 13, respectively, are formed.

Figure 20B:
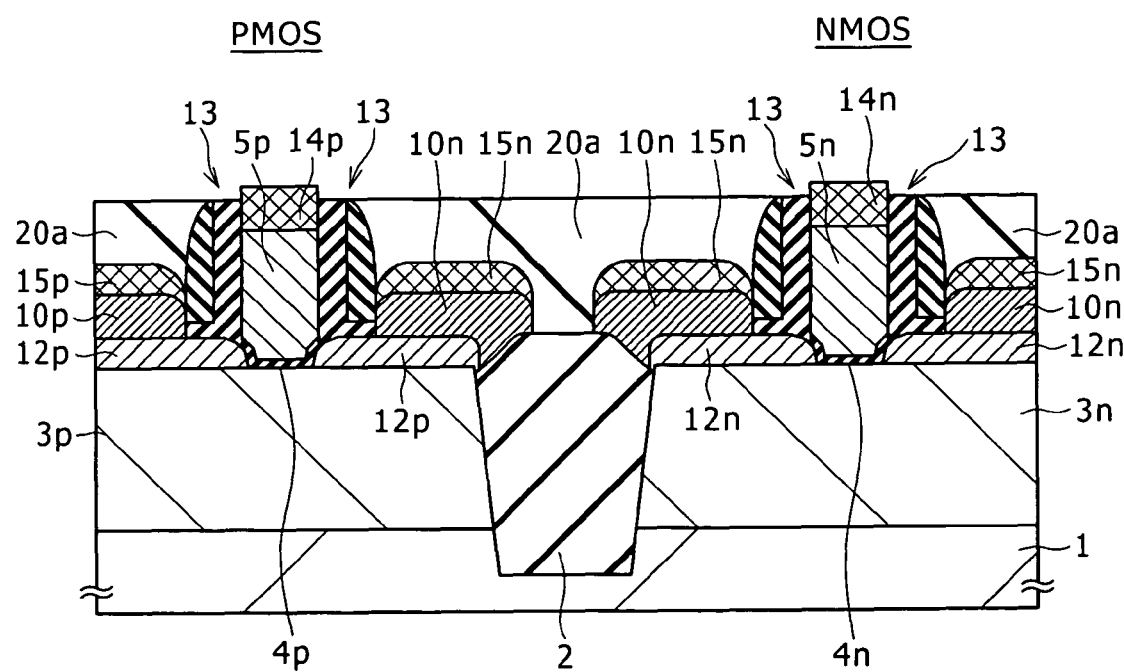

Silicide layers 14n and 14p are simultaneously formed on the gate electrodes 5n and 5p, respectively, by utilizing the same method as that utilized in the process shown in FIG. 16B (FIG. 20B). Then, an additional interlayer insulating film 20a is deposited, thereby forming the interlayer insulating film 20 shown in FIG. 1. As a result, the basic structure of the CMOS device is completed.

Thereafter, while not especially illustrated, a connecting layer is formed which contacts each of the silicide layers 15n and 15p and is filled within the interlayer film 20, and when necessary, a wiring (not shown) as an overlying layer, and the like are formed, thereby completing the CMOS device concerned.

According to this embodiment, the following benefit is obtained.

In the ultra fine transistor in which the gate length of 20 nm or less is realized, it is found out from the estimation by the simulation that with respect to the junction depth from the substrate surface of the extension portion in which the channel is formed, the range of about 4 nm to about 5 nm is required for the upper surface of the depletion layer (i.e., the boundary surface between the space charge neutral region on the source or drain region side and the depletion layer in the ideal case where no digging is caused in the substrate and no reduction of the carrier density is caused in the gate corner portion. However, in the actual case, there are caused the digging of the substrate and the reduction of the carrier density in the gate corner portion, and there are the various configurations of the extension portions, and the various concentrations of the extension portions. From this, it is found out that the junction depth of about 10 nm at the maximum is enough even in a state in which these error factors are absorbed.

However, in the case of the conventional method, the impurities thermally diffuse from the extension portion to exceed the necessary junction depth. The reason for this is that the source/drain region is formed by utilizing the ion implantation and the activation anneal therefor.

In the conventional case, the source/drain region with high concentration needs to be formed to a deep level of the substrate from a viewpoint of realization of the sufficient low internal resistance and contact resistance, prevention of an increase in junction leakage current by the silicide layer, and the like. In order to make the activation rate of the impurities through such deep ion implantation (high energy implantation) sufficient, the sufficient anneal at a high temperature is required all the more. As a result, it is impossible to suppress the thermal diffusion in the extension portion.

According to this embodiment, since the source/drain region is formed from the epitaxial growth layer, even when the source/drain region is given the conductive property by utilizing the ion implantation method, the implantation energy can be reduced and it is also unnecessary to make the anneal condition hard. In addition, when the In-situ doping as the preferable method of giving the source/drain region the conductive property is used, the activation anneal becomes unnecessary, and thus the effect of suppressing the thermal diffusion is further enhanced. Moreover, the height of the formation surface of the silicide layer required to prevent the junction leakage current can be freely changed by controlling the thickness of the epitaxial growth layer.

From the foregoing, in this embodiment, it is possible to realize the ultra fine MIS transistor in which the short channel effect is sufficiently suppressed with the necessary and minimum amount of diffused impurities.

In addition, in this embodiment, the gate electrode can be precisely stacked on the inclined end faces of the extension portions. That is to say, the insulating film (the $SiO_2$ film 41 in this embodiment) for regulating the stacking amount by its thickness is precisely formed on the both side faces of the dummy stack 6, respectively. Then, the insulating film is etched away in order to form the gate opening portion through the damascene process, thereby extending the opening. As a result, the space in which the gate electrode is to be filled is also formed upward with respect to the inclined end faces of the extension portions. This results in that the amount of stacking between the gate electrode and the extension portions can be precisely controlled.

Moreover, the material (the SiN film 13A in this embodiment) having a relatively low etching rate in the wet etching using a hydrofluoric acid or the like, or the dry etching such as the hydrofluoric acid baking is used in the sidewall insulating film so as to function as the etching stopper at that time. Furthermore, the sidewall insulating film (the $SiO_2$ film 13B in this embodiment) formed outside that sidewall insulating film is made of the material having the low dielectric constant, thereby realizing the reduction of the parasitic capacity.

These sidewall insulating films are used as the separating layer as well for the second epitaxial growth layer becoming the source/drain region.

These sidewall insulating films are the so-called sidewall spacer and the controllability of their thicknesses is high. This is useful to suppress the dispersion in the resistance value of the parasitic capacity, and the dispersion in the resistance value of the extension portion.

In addition, according to the manufacturing method shown in this embodiment, the epitaxial growth can be selectively performed on the PMOS transistor side and the NMOS transistor side, respectively. At this time, while two kinds of protecting films for protecting only the respective one sides are required, these films are made of the materials (the SiN film 7a and the $SiO_2$ film 8a in this embodiment) having the high etching selectivities to each other. As a result, the method is realized in which the amount of over-etching is less when these films are removed. This results in that the amount of digging of the substrate is suppressed, and an increase in junction depth Xj of the extension portion is suppressed as much as possible.

The present invention can be generally applied to the semiconductor product having the MIS type field-effect transistor, and the method of manufacturing the same.

While a preferred embodiment of the present invention has been described using specific terms, such description is for illustrative purposes only, and it is to be understood that changes and variations may be made without departing from the spirit or scope of the following claims.

What is claimed is:

1. An insulated gate field-effect transistor having:
a semiconductor substrate;
a channel region in the semiconductor substrate;
a gate insulating film on the substrate above the channel region;
a gate electrode above the channel region and above the gate insulating film;
two first epitaxial growth layers on the substrate;
a sidewall spacer comprising a first layer and a second layer (1) a bottom surface of the first layer on a portion of the upper surface of the first epitaxial growth layers, (2) an upper surface of the first layer opposite of the bottom surface of the first layer, (3) a first side surface of the first layer next to the gate electrode and (4) a second side surface of the first layer located opposite of the first side surface (5) a first side surface of the second layer adjacent the second side surface of the first layer, (6) a second side surface of the second layer located opposite of the first side surface of the second layer, and (7) a bottom surface of the second layer on the upper surface of the first layer; and two source/drain regions in the form of two second epitaxial growth layers respectively on the first epitaxial growth layers and adjacent to the second side surface of the second layer, wherein, the sidewall spacer establishes a horizontal distance between the gate electrode and said second epitaxial growth layer, and a portion of each first epitaxial growth layer is located underneath the gate electrode.

2. The insulated gate field-effect transistor according to claim 1, wherein an alloy layer made of an alloy of a semiconductor and metal is on said second epitaxial growth layer, and said second epitaxial growth layer has a thickness such that a bottom surface of said alloy layer is above said first epitaxial growth layer.

3. The insulated gate field-effect transistor according to claim 1, wherein an end of the first epitaxial growth layer located next to the side face of the gate electrode is inclined and has a distance, from said gate electrode, which increases as the height of the side face of the gate electrode increases, and the gate electrode is partially stacked on said inclined end of the first epitaxial growth layer and the gate insulating film.

* * * * *